US012757511B2

(12) United States Patent
Park et al.

(10) Patent No.: US 12,757,511 B2
(45) Date of Patent: Oct. 6, 2026

(54) IMAGE SENSOR AND ELECTRONIC APPARATUS INCLUDING THE SAME

(71) Applicant: SAMSUNG ELECTRONICS CO., LTD., Suwon-si (KR)

(72) Inventors: Hyunsung Park, Suwon-si (KR); Sookyoung Roh, Suwon-si (KR); Sangeun Mun, Suwon-si (KR); Sungmo Ahn, Suwon-si (KR); Junho Lee, Suwon-si (KR); Choonlae Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 19/009,468

(22) Filed: Jan. 3, 2025

(65) Prior Publication Data

US 2025/0221075 A1 Jul. 3, 2025

(30) Foreign Application Priority Data

Jan. 3, 2024 (KR) ........................ 10-2024-0000966

(51) Int. Cl.
*H10F 39/00* (2025.01)

(52) U.S. Cl.
CPC ..... *H10F 39/8063* (2025.01); *H10F 39/8053* (2025.01); *H10F 39/8057* (2025.01)

(58) Field of Classification Search
CPC ............................. H10F 39/182; H10F 39/806
See application file for complete search history.

(56) References Cited

U.S. PATENT DOCUMENTS

| | | | |
|---|---|---|---|
| 3,971,065 | A | 7/1976 | Bayer |
| 8,289,422 | B2 | 10/2012 | Hiramoto et al. |
| 8,305,527 | B2 | 11/2012 | Lee et al. |
| 2012/0206637 | A1 | 8/2012 | Hiramoto et al. |
| 2015/0286060 | A1 | 10/2015 | Roh et al. |

(Continued)

FOREIGN PATENT DOCUMENTS

| | | |
|---|---|---|
| KR | 10-2159166 B1 | 9/2020 |
| KR | 10-2276432 B1 | 7/2021 |
| KR | 10-2501643 B1 | 2/2023 |

OTHER PUBLICATIONS

Nishiwaki et al., "Efficient colour splitters for high-pixel-density image sensors", Nature Photonics, 2013, vol. 7, Doi: 10.1038/NPHOTON.2012.345, pp. 240-246 (7 pages total).

*Primary Examiner* — Thanh Luu
(74) *Attorney, Agent, or Firm* — Sughrue Mion, PLLC

(57) ABSTRACT

Provided is an image sensor including a sensor substrate including first, second, third and fourth pixels, and a color separation lens array to separate incident light based on wavelengths and condense the separated incident light onto first, second, third, and fourth pixels, the color separation lens array including a plurality of nanoposts and a peripheral material located around the plurality of nanoposts, and the plurality of nanoposts including a plurality of main posts each having a refractive index greater than a refractive index of the peripheral material and a plurality of sub-posts each having a refractive index less than the refractive index of the peripheral material, and among the first, second, third, and fourth pixel corresponding regions of the color separation lens array, a sub-post fill factor in the second pixel corresponding region being the largest.

20 Claims, 18 Drawing Sheets

(56) References Cited

U.S. PATENT DOCUMENTS

| | | | | |
|---|---|---|---|---|
| 2016/0064448 | A1* | 3/2016 | Shin | H10F 39/806 257/292 |
| 2017/0092668 | A1 | 3/2017 | Kim et al. | |
| 2020/0285066 | A1 | 9/2020 | Nam et al. | |
| 2021/0125301 | A1* | 4/2021 | Park | G06T 1/0007 |

* cited by examiner

IMAGE SENSOR AND ELECTRONIC APPARATUS INCLUDING THE SAME

CROSS-REFERENCE TO RELATED APPLICATION

This application claims priority to Korean Patent Application No. 10-2024-0000966, filed on Jan. 3, 2024, in the Korean Intellectual Property Office, the disclosure of which is incorporated by reference herein in its entirety.

BACKGROUND

1. Field

Example embodiments of the present disclosure relate to an image sensor and an electronic apparatus including the same.

2. Description of the Related Art

Image sensors typically detect a color of incident light by using a color filter. However, the color filter absorbs lights of colors other than a color corresponding to the color filter, and thus light utilization efficiency may be reduced. For example, in the case of using red-green-blue (RGB) color filters, only one-third of an incident light is transmitted and two-thirds of the incident light is absorbed, and thus the light utilization efficiency is only about 33%. Most light loss of an image sensor occurs in color filters. Accordingly, attempts are being made to separate a color into each pixel of the image sensor without using the color filter.

SUMMARY

One or more embodiments provide image sensors including a color separation lens array capable of separating incident light by wavelength and condensing light.

One or more embodiments also provide image sensors having improved color separation performance.

Additional aspects will be set forth in part in the description which follows and, in part, will be apparent from the description, or may be learned by practice of example embodiments of the disclosure.

According to an aspect of an example embodiment, there is provided an image sensor including a sensor substrate including a first pixel and a fourth pixel configured to detect green light, a second pixel configured to detect blue light, and a third pixel configured to detect red light, and a color separation lens array spaced apart from the sensor substrate in a first direction, the color separation lens array being configured to separate incident light based on wavelengths and condense the separated incident light onto the first pixel, the second pixel, the third pixel, and the fourth pixel, wherein the color separation lens array includes a plurality of nanoposts and a peripheral material on side surfaces of the plurality of nanoposts, wherein a region of the color separation lens array includes a first pixel corresponding region, a second pixel corresponding region, a third pixel corresponding region, and a fourth pixel corresponding region facing the first pixel, the second pixel, the third pixel, and the fourth pixel, respectively, and the plurality of nanoposts are provided in the first pixel corresponding region, the second pixel corresponding region, the third pixel corresponding region, and the fourth pixel corresponding region, wherein the plurality of nanoposts include a plurality of main posts each having a refractive index greater than a refractive index of the peripheral material and a plurality of sub-posts each having a refractive index less than the refractive index of the peripheral material, and wherein in respective cross-sections of the first pixel corresponding region, the second pixel corresponding region, the third pixel corresponding region, and the fourth pixel corresponding region which are perpendicular to the first direction, ratios of a sum of respective areas of the plurality of sub-posts to a sum of respective areas of the plurality of main posts are a first fill factor, a second fill factor, a third fill factor, and a fourth fill factor, respectively, the second fill factor among being largest among the first fill factor, the second fill factor, the third fill factor, and the fourth fill factor.

The plurality of sub-posts may include air-holes adjacent to the peripheral material.

Two or more sub-posts among the plurality of sub-posts may be provided in the second pixel corresponding region, and a sub-post among the two sub-posts located farther from a center of the second pixel corresponding region may have a smaller cross-sectional size than the other sub-post among the two sub-posts.

The second fill factor may be greater than 1.

In the second pixel corresponding region, a number of the plurality of sub-posts may be greater than a number of the plurality of main posts.

The third fill factor among the first fill factor, the second fill factor, the third fill factor, and the fourth fill factor may be smallest.

The first fill factor, the third fill factor, and the fourth fill factor may be 0.

In each of the first pixel corresponding region, the third pixel corresponding region, and the fourth pixel corresponding region, the subposts are located relatively in a peripheral area than the main posts are located.

The plurality of nanoposts may be provided sequentially in the first direction in a first lens layer and a second lens layer.

Among the first fill factor, the second fill factor, the third fill factor, and the fourth fill factor of the first lens layer, the second fill factor may be largest, and among the first fill factor, the second fill factor, the third fill factor, and the fourth fill factor of the second lens layer, the second fill factor may be largest.

Among the first fill factor, the second fill factor, the third fill factor, and the fourth fill factor of the first lens layer, the third fill factor may be smallest, and among the first fill factor, the second fill factor, the third fill factor, and the fourth fill factor of the second lens layer, the third fill factor may be smallest.

In the second lens layer, the first fill factor, the third fill factor, and the fourth fill factor may be 0.

The plurality of sub-posts may be not included in the first lens layer and may be included in the second lens layer.

The second fill factor of the second lens layer may be greater than 1.

In the second lens layer of the second pixel corresponding region, a number of the plurality of sub-posts may be greater than a number of the plurality of main posts.

The image sensor may further include an etch stop layer between the first lens layer and the second lens layer.

Among the plurality of sub-posts, two sub-posts facing each other between the first lens layer and the second lens layer may contact each other.

The image sensor may further include an anti-reflection layer on a light-receiving surface of the color separation lens array, the anti-reflection layer including a plurality of holes periodically arranged two-dimensionally.

The image sensor may further include a color filter array between the sensor substrate and the color separation lens array.

According to another aspect of an example embodiment, there is provided an electronic apparatus including a lens assembly including one or more lenses and configured to form an optical image of a subject, an image sensor configured to convert the optical image formed by the lens assembly into an electrical signal, and a processor configured to process a signal obtained by the image sensor, wherein the image sensor includes a sensor substrate including a first pixel and a fourth pixel configured to detect green light, a second pixel configured to detect blue light, and a third pixel configured to detect red light, and a color separation lens array spaced apart from the sensor substrate in a first direction, the color separation lens array being configured to separate incident light based on wavelengths and condense the separated incident light onto the first pixel, the second pixel, the third pixel, and the fourth pixel, wherein the color separation lens array includes a plurality of nanoposts and a peripheral material on side surfaces of the plurality of nanoposts, wherein the color separation lens array includes a first pixel corresponding region, a second pixel corresponding region, a third pixel corresponding region, and a fourth pixel corresponding region facing the first pixel, the second pixel, the third pixel, and the fourth pixel, respectively, and the plurality of nanoposts are provided in the first pixel corresponding region, the second pixel corresponding region, the third pixel corresponding region, and the fourth pixel corresponding region, wherein the plurality of nanoposts include a plurality of main posts each having a refractive index greater than a refractive index of the peripheral material and a plurality of sub-posts each having a refractive index less than the refractive index of the peripheral material, and wherein in respective cross-sections of the first pixel corresponding region, the second pixel corresponding region, the third pixel corresponding region, and the fourth pixel corresponding region which are perpendicular to the first direction, ratios of a sum of respective areas of the plurality of sub-posts to a sum of respective areas of the plurality of main posts are a first fill factor, a second fill factor, a third fill factor, and a fourth fill factor, respectively, the second fill factor among the first fill factor, the second fill factor, the third fill factor, and the fourth fill factor being largest among the first fill factor, the second fill factor, the third fill factor, and the fourth fill factor.

According to still another aspect of an example embodiment, there is provided an image sensor including a sensor substrate including a first pixel and a fourth pixel configured to detect green light, a second pixel configured to detect blue light, and a third pixel configured to detect red light, and a color separation lens array spaced apart from the sensor substrate in a first direction, the color separation lens array being configured to separate incident light based on wavelengths and condense the separated incident light onto the first pixel, the second pixel, the third pixel, and the fourth pixel, wherein the color separation lens array includes a plurality of nanoposts and a peripheral material on side surfaces of the plurality of nanoposts, wherein a region of the color separation lens array includes a first pixel corresponding region, a second pixel corresponding region, a third pixel corresponding region, and a fourth pixel corresponding region facing the first pixel, the second pixel, the third pixel, and the fourth pixel, respectively, and the plurality of nanoposts are provided in the first pixel corresponding region, the second pixel corresponding region, the third pixel corresponding region, and the fourth pixel corresponding region, wherein the plurality of nanoposts include a plurality of main posts each having a refractive index greater than a refractive index of the peripheral material and a plurality of sub-posts each having a refractive index less than the refractive index of the peripheral material, and wherein each of the first pixel corresponding region, the second pixel corresponding region, the third pixel corresponding region, and the fourth pixel corresponding region includes the plurality of main posts, and the second pixel corresponding region includes the plurality of sub-posts.

BRIEF DESCRIPTION OF DRAWINGS

The above and other aspects, features, and advantages of example embodiments will be more apparent from the following description taken in conjunction with the accompanying drawings, in which.

DETAILED DESCRIPTION

Figure 1:
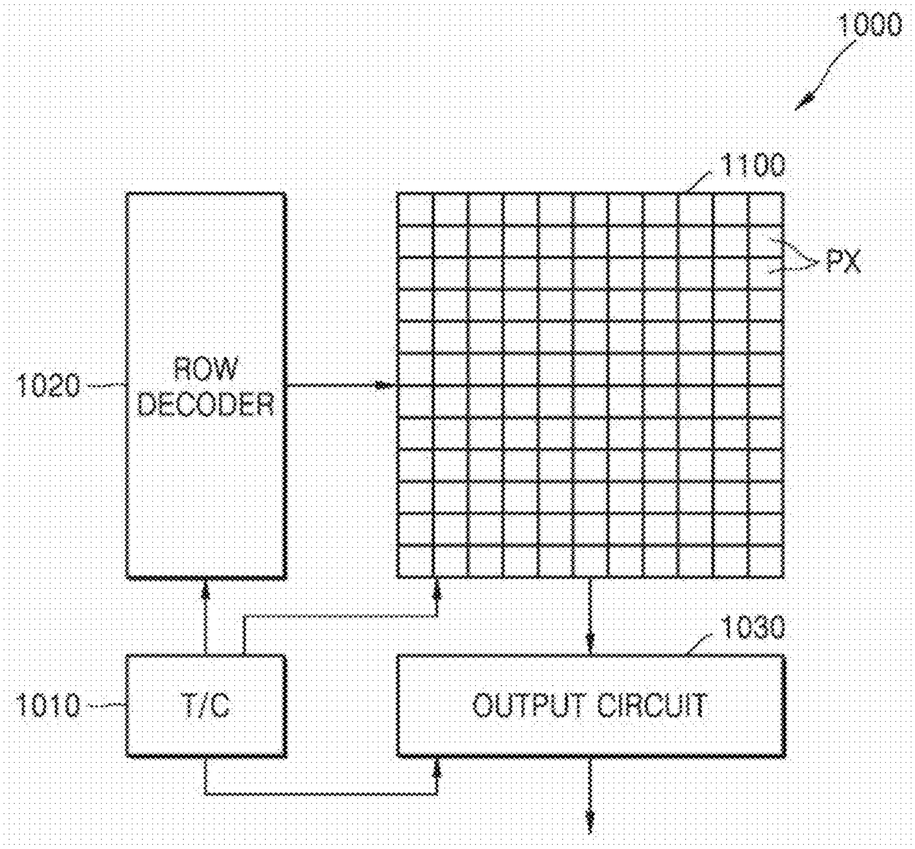
FIG. 1 is a block diagram of an image sensor according to an example embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings. The present embodiments may have different forms and should not be construed as being limited to the descriptions set forth herein. Like reference numerals in the drawings denote like elements, and, in the drawings, the sizes of elements may be exaggerated for clarity and for convenience of explanation.

It will be understood that when a layer is referred to as being "on" another layer or substrate, it can be directly on the other layer or substrate, or intervening layers may also be present.

Such terms as "first", "second", etc., may be used to describe various components, but are used only for the purpose of distinguishing one component from other components. These terms do not limit a difference in the materials or structures of the components.

An expression used in the singular encompasses the expression of the plural, unless it has a clearly different meaning in the context. The terms "comprises" and/or "comprising" or "includes" and/or "including" when used in this specification, specify the presence of stated elements, but do not preclude the presence or addition of one or more other elements.

The terms "unit", "-er (-or)", and "module" when used in this specification refers to a unit in which at least one function or operation is performed, and may be implemented as hardware, software, or a combination of hardware and software.

The use of the terms "a" and "an" and "the" and similar referents are to be construed to cover both the singular and the plural.

The operations that constitute a method can be performed in any suitable order unless otherwise indicated herein. The use of any and all exemplary language (e.g., "such as") provided herein is intended merely to explain the technical spirit of the disclosure in detail and does not pose a limitation on the scope of the disclosure unless otherwise claimed.

Referring to FIG. 1, an image sensor 1000 according to an example embodiment may include a pixel array 1100, a timing controller 1010, a row decoder 1020, and an output circuit 1030. The image sensor 1000 may include a charge-coupled device (CCD) image sensor or a complementary metal oxide semiconductor (CMOS) image sensor.

The pixel array 1100 includes pixels two-dimensionally arranged in a plurality of rows and columns. The row decoder 1020 may select one of the rows of the pixel array 1100 in response to a row address signal output by the timing controller 1010. The output circuit 1030 outputs a light detection signal in units of columns from a plurality of pixels arranged in the selected row. To this end, the output circuit 1030 may include a column decoder and an analog-to-digital converter (ADC). For example, the output circuit 1030 may include a plurality of ADCs arranged for each column between the column decoder and the pixel array 1100, or a single ADC arranged at an output end of the column decoder. The timing controller 1010, the row decoder 1020, and the output circuit 1030 may be implemented by using a single chip or separate chips. A processor for processing an image signal output through the output circuit 1030 may be implemented by using a single chip together with the timing controller 1010, the row decoder 1020, and the output circuit 1030.

The pixel array 1100 may include a plurality of pixels PX that detect light of different wavelength bands. An arrangement of the pixels may be implemented in various ways. The pixel array 1100 may include a color separation lens array that separates incident light by wavelength and allows light of different wavelengths to be incident on the plurality of pixels PX.

Figure 2A:
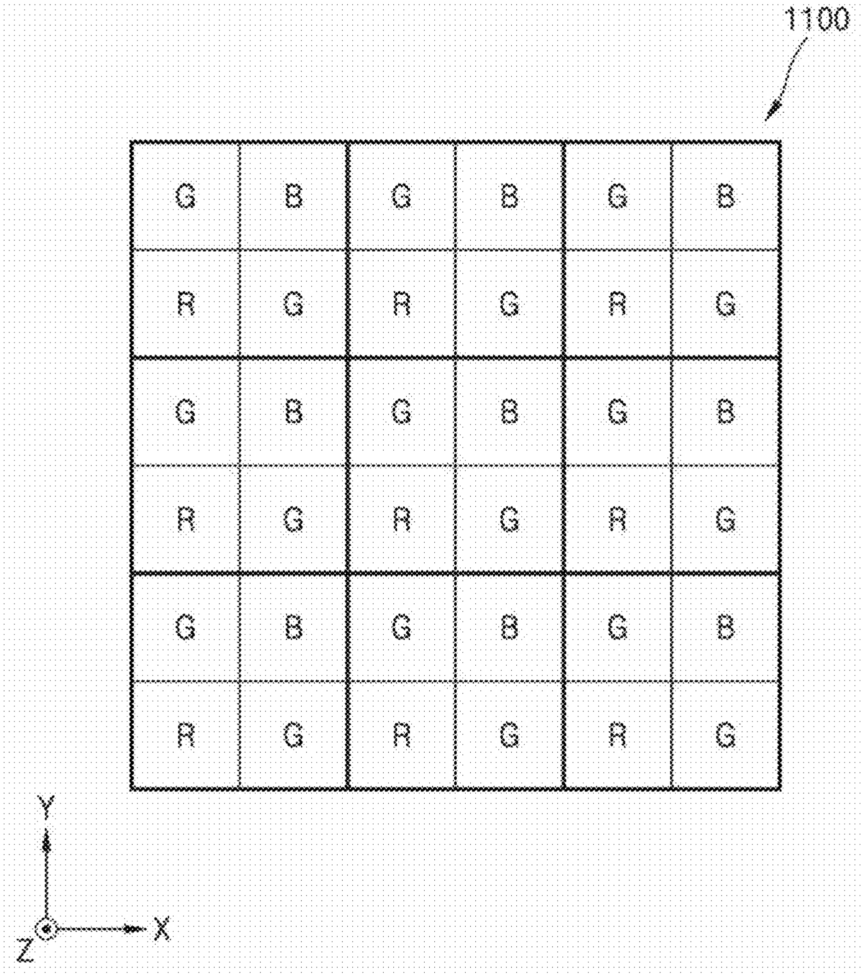
FIG. 2A is a plan view showing a color arrangement of a pixel array of the image sensor according to an example embodiment.
Figure 2B:
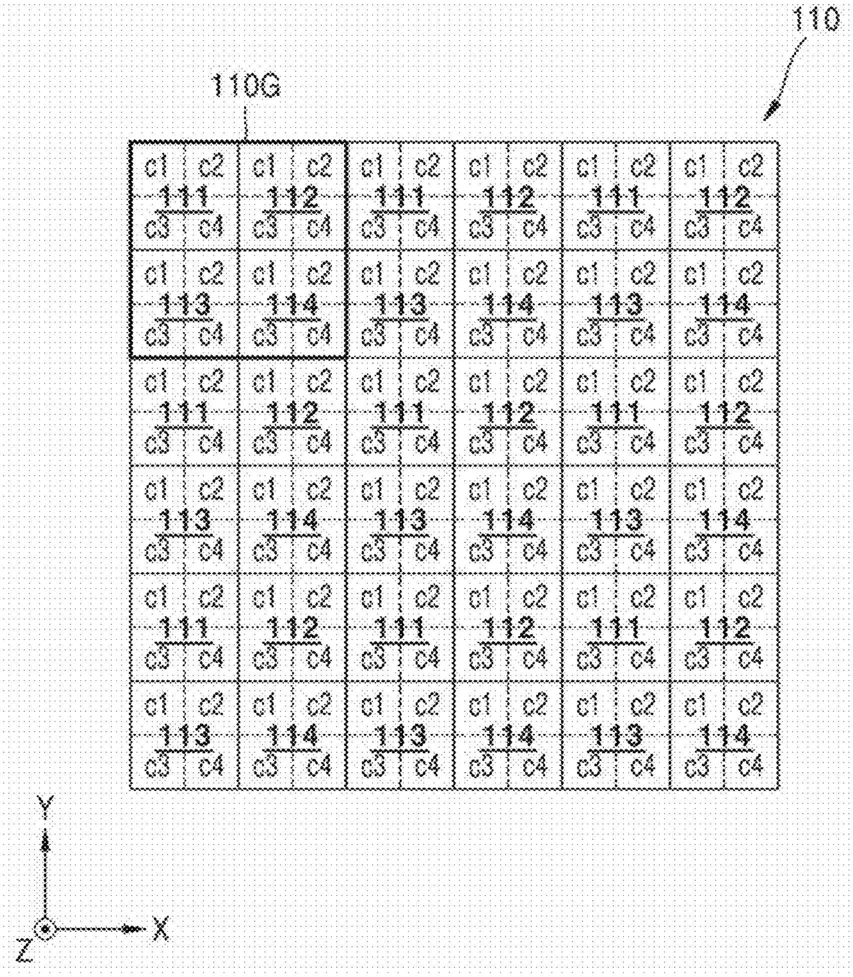
FIGS. 2B and 2C are plan views respectively showing a sensor substrate and a color separation lens array both included in the pixel array of the image sensor according to an example embodiment.
Figure 2C:
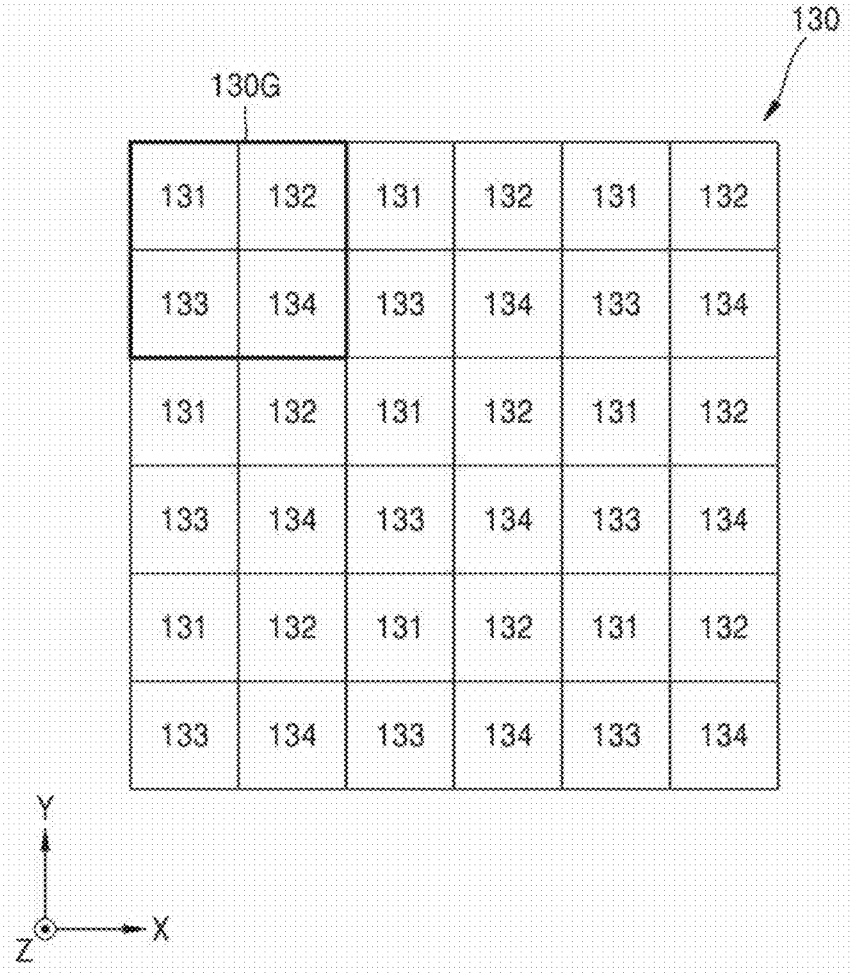

FIG. 2A is a plan view showing a color arrangement of a pixel array 1100 of the image sensor 1000 according to an example embodiment. FIGS. 2B and 2C are plan views respectively showing a sensor substrate 110 and a color separation lens array 130 included in the pixel array 1100 of the image sensor 1000 according to an example embodiment.

The color arrangement shown in FIG. 2A is a Bayer pattern arrangement that may be used in image sensors. As shown in FIG. 2A, one unit pattern may include four quadrant regions, and first, second, third, and fourth quadrant regions may represent blue (B), green (G), red (R), and green (G), respectively. This unit pattern repeats two-dimensionally in a first direction (X direction) and a second direction (Y direction). For this color arrangement, two green pixels may be arranged in one diagonal direction, and one blue pixel and one red pixel may be arranged in the other diagonal direction, within a unit pattern in the form of a 2×2 array. For example, a first row in which a plurality of green pixels and a plurality of blue pixels alternate with each other in the first direction and a second row in which a plurality of red pixels and a plurality of green pixels alternate with each other in the first direction may repeat in the second direction.

The color arrangement of FIG. 2A is an example, and embodiments are not limited thereto. For example, a CYGM arrangement in which magenta (M), cyan (C), yellow (Y), and green (G) are represented in one unit pattern, or an RGBW arrangement in which green, red, blue, and white are represented in one unit pattern may be used. In addition, a unit pattern may be implemented in the form of a 3×2 array, and the pixels in the pixel array 1100 may be arranged in various ways according to color characteristics of the image sensor 1000. An example in which the pixel array 1100 of the image sensor 1000 has the Bayer pattern will be described below, but an operation principle may be applied to types of pixel arrangements other than the Bayer pattern.

The pixel array 1100 of the image sensor 1000 may include the sensor substrate 110 having a pixel arrangement corresponding to such a color arrangement, and the color separation lens array 130 that condenses corresponding light onto a specific pixel of the sensor substrate 110. FIGS. 2B and 2C are plan views respectively showing the sensor substrate 110 and the color separation lens array 130 both described above.

Referring to FIG. 2B, the sensor substrate 110 may include a plurality of pixels PX detecting incident light. The sensor substrate 110 may include a plurality of unit pixel groups 110G. The unit pixel group 110G includes a first pixel 111, a second pixel 112, a third pixel 113, and a fourth pixel 114 each generating an image signal by converting incident light into an electrical signal. The unit pixel group 110G may have a Bayer pattern-shaped pixel arrangement.

The pixels included in the sensor substrate 110 are arranged to sense the incident light by classifying the incident light into unit patterns, such as the Bayer pattern. For example, the first pixel 111 and the fourth pixel 114 may be green pixels that detect green light, the second pixel 112 may be a blue pixel that detects blue light, and the third pixel 113 may be a red pixel that detects red light. Hereinafter, a pixel arrangement of an image sensor may be interchangeably used with a pixel arrangement of a sensor substrate. In addition, hereinafter, the first pixel 111 and the fourth pixel 114 may be interchangeably used as a first green pixel and a second green pixel, respectively, the second pixel 112 as a blue pixel, and the third pixel 113 as a red pixel. However, this is only for convenience of explanation, and embodiments are not limited thereto.

Each of the first, second, third and fourth pixels 111, 112, 113, and 114 may include a plurality of photosensitive cells c1, c2, c3, and c4 that independently sense incident light. For example, each of the first, second, third and fourth pixels 111, 112, 113, and 114 may include a first photosensitive cell c1, a second photosensitive cell c2, a third photosensitive cell c3, and fourth photosensitive cell c4. The first, second, third and fourth photosensitive cells c1, c2, c3, and c4 may be arranged two-dimensionally in the first direction (X direction) and the second direction (Y direction). For example, the first, second, third and fourth photosensitive cells c1, c2, c3, and c4 included in each of the first, second, third and fourth pixels 111, 112, 113, and 114 may be arranged in a 2×2 array.

In FIG. 2B, each of the first, second, third and fourth pixels 111, 112, 113, and 114 includes four photosensitive cells. However, embodiments are not limited thereto, and each of the first, second, third and fourth pixels 111, 112, 113, and 114 may include one photosensitive cell, may include two photosensitive cells, or may include four or more independent photosensitive cells clustered and arranged in a two-dimensional manner. For example, each of the first, second, third and fourth pixels 111, 112, 113, and 114 may include a plurality of independent photosensitive cells clustered and arranged in a 3×3 array or 4×4 array. For example, a configuration where each of the first, second, third and fourth pixels 111, 112, 113, and 114 includes photosensitive cells arranged in a 2×2 array will now be described.

According to an example embodiment, some of a plurality of pixels including a plurality of photosensitive cells that sense light of the same color may be used as autofocusing (AF) pixels. In an AF pixel, an AF signal may be obtained from a difference between output signals of adjacent photosensitive cells. For example, an AF signal in the first direction (X direction) may be generated from a difference between an output signal of the first photosensitive cell c1 and an output signal of the second photosensitive cell c2, a difference between an output signal of the third photosensitive cell c3 and an output signal of the fourth photosensitive cell c4, or a difference between a sum of the output signals of the first photosensitive cell c1 and the third photosensitive cell c3 and a sum of the output signals of the second photosensitive cell c2 and the fourth photosensitive cell c4. An AF signal in the second direction (Y direction) may be generated from a difference between the output signal of the first photosensitive cell c1 and the output signal of the third photosensitive cell c3, a difference between the output signal of the second photosensitive cell c2 and the output signal of the fourth photosensitive cell c4, or a difference between a sum of the output signals of the first photosensitive cell c1 and the second photosensitive cell c2 and a sum of the output signals of the third photosensitive cell c3 and the fourth photosensitive cell c4. Autofocusing performance using this AF signal may depend on the shape of nanoposts included in the color separation lens array 130. The greater an autofocus contrast is, the greater autofocusing sensitivity is, which may improve an AF performance.

Methods of obtaining a general image signal include a sum mode and a full mode. In the sum mode, an image signal may be obtained by summing the output signals of the first, second, third and fourth photosensitive cells c1, c2, c3, and c4. For example, a first green image signal may be generated by summing the output signals of the first, second, third and fourth photosensitive cells c1, c2, c3, and c4 of the first pixel 111, a blue image signal may be generated by summing the output signals of the first, second, third and fourth photosensitive cells c1, c2, c3, and c4 of the second pixel 112, a red image signal may be generated by summing the output signals of the first, second, third and fourth photosensitive cells c1, c2, c3, and c4 of the third pixel 113, and a second green image signal may be generated by summing the output signals of the first, second, third and fourth photosensitive cells c1, c2, c3, and c4 of the fourth pixel 114. In the full mode, each output signal is obtained by using each of the first, second, third and fourth photosensitive cells c1, c2, c3, and c4 as an individual pixel. In this case, an image of relatively high resolution may be obtained.

Referring to FIG. 2C, the color separation lens array 130 includes a plurality of pixel-corresponding regions, each of which includes nanoposts. The region division of the color separation lens array 130 and the shapes and arrangement of the nanoposts provided in each of the plurality of pixel-corresponding regions may be set to form a phase profile that enables incident light to be divided according to wavelengths and be condensed on corresponding pixels that face each of the plurality of pixel-corresponding regions, respectively. In the following description, color separation in a visible light band will be explained. However, embodiments are not limited thereto, and a wavelength band may be expanded to the range of visible light to infrared light, or to any of various other ranges.

The color separation lens array 130 includes a plurality of pixel-corresponding groups 130G corresponding to the plurality of unit pixel groups 110G of the sensor substrate 110 shown in FIG. 2B, respectively. Each of the plurality of pixel corresponding groups 130G includes a first pixel-corresponding region 131, a second pixel-corresponding region 132, a third pixel-corresponding region 133, and a fourth pixel-corresponding region 134 corresponding to the first, second, third, and fourth pixels 111, 112, 113, and 114. Each of the first, second, third, and fourth pixel-corresponding regions 131, 132, 133, and 134 includes a plurality of nanoposts. The plurality of nanoposts are configured to separate incident light according to wavelengths and condense the separated incident light onto the first, second, third, and fourth pixels 111, 112, 113, and 114 respectively corresponding to the wavelengths. As described above with reference to FIG. 2B, the first pixel 111 and the fourth pixel 114 may be a first green pixel and a second green pixel, respectively, the second pixel 112 may be a blue pixel, and the third pixel 113 may be a red pixel. In this case, the first pixel-corresponding region 131 and the fourth pixel-corresponding region 134 may be interchangeably used as a first green pixel-corresponding region and a second green pixel-corresponding region, respectively, the second pixel-corresponding region 132 as a blue pixel-corresponding region, and the third pixel-corresponding region 133 as a red pixel-corresponding region.

Figure 3A:
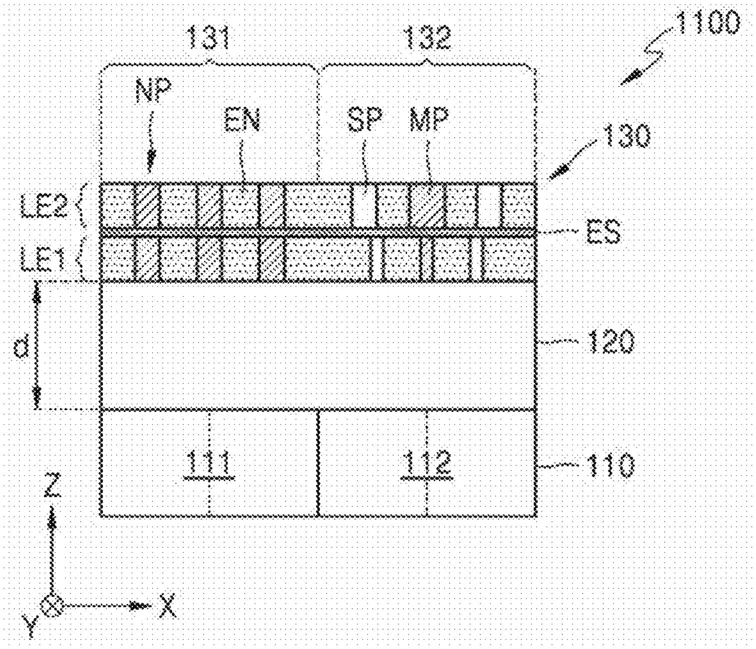
FIGS. 3A and 3B are cross-sectional views showing the pixel array of the image sensor according to an example embodiment, respectively.
Figure 3B:
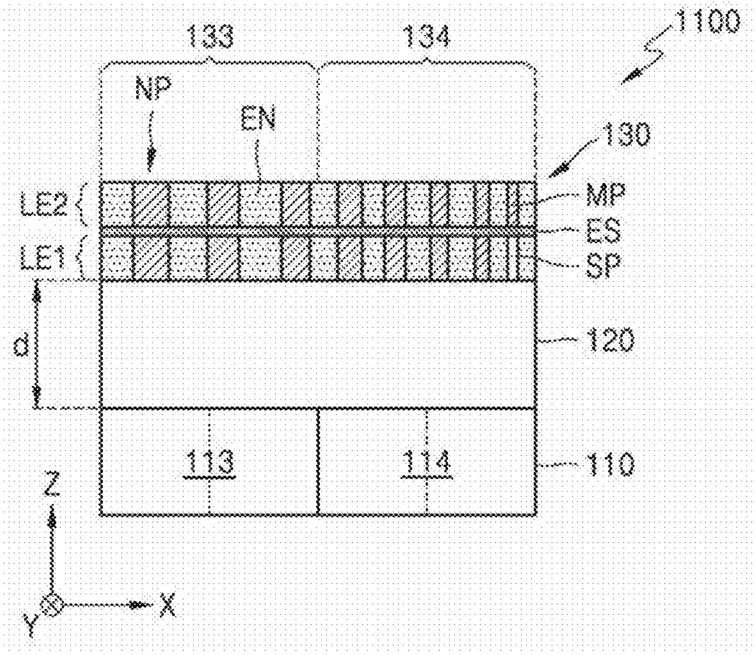
Figure 4A:
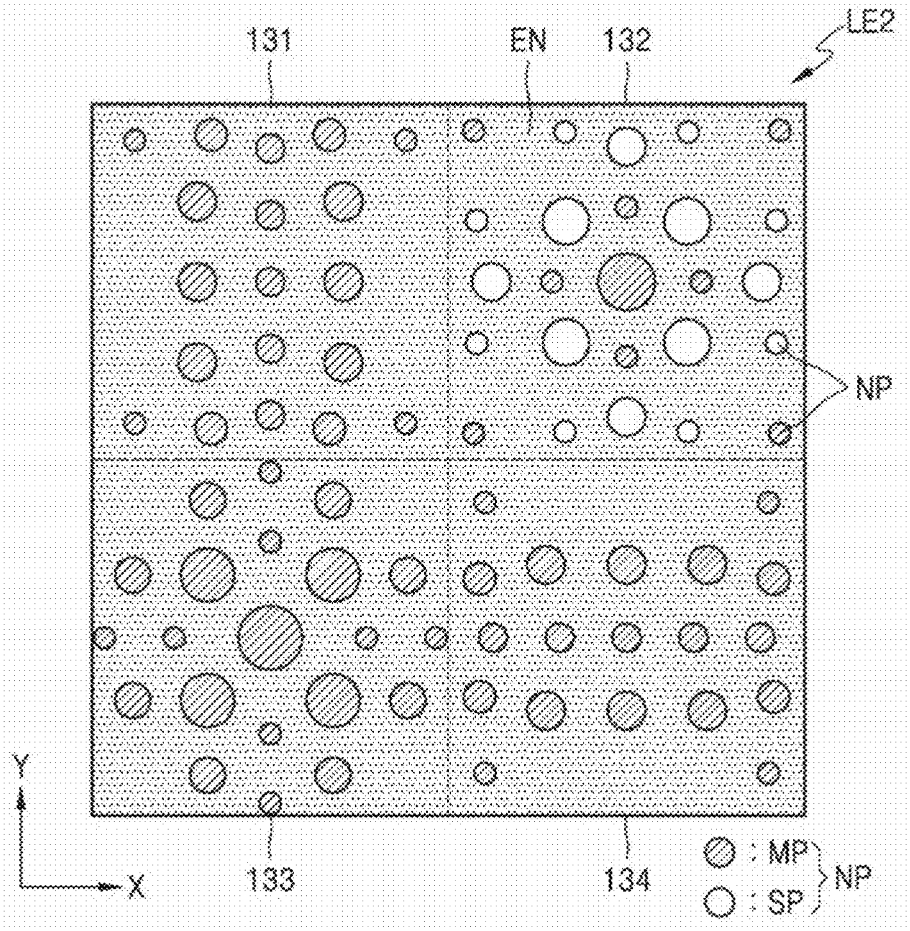
FIGS. 4A and 4B are plan views illustrating an exemplary arrangement of nanoposts included in a pixel corresponding region included in a color separation lens array of the pixel array of the image sensor according to an example embodiment and showing a second lens layer and a first lens layer, respectively.
Figure 4B:
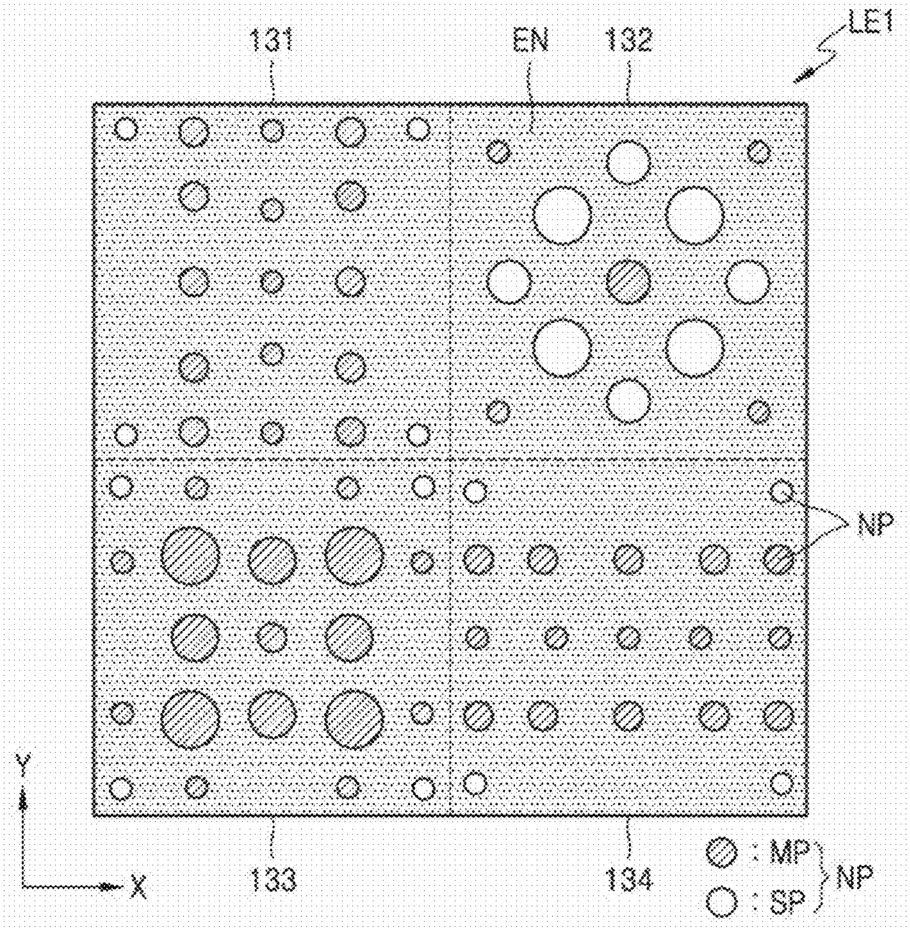

FIGS. 3A and 3B are cross-sectional views showing the pixel array 1100 of the image sensor 1000 according to an example embodiment, respectively. FIGS. 4A and 4B are plan views illustrating an exemplary arrangement of nanoposts included in a pixel corresponding region included in the color separation lens array of the pixel array of the image sensor according to the example embodiment and showing a second lens layer LE2 and a first lens layer LE1, respectively.

Referring to FIGS. 3A and 3B, the pixel array 1100 of the image sensor includes the sensor substrate 110 and the color separation lens array 130 disposed on the sensor substrate 110.

As described above with reference to FIG. 2B, the sensor substrate 110 may include the first pixel 111, the second pixel 112, the third pixel 113, and the fourth pixel 114 each sensing light, and the first pixel 111, the second pixel 112, the third pixel 113, and the fourth pixel 114 may each include a plurality of photosensitive cells. A separation layer for cell separation may be further formed at a boundary between the photosensitive cells.

The color separation lens array 130 may include the first pixel corresponding region 131 and the fourth pixel corresponding region 134 respectively corresponding to the first pixel 111 and the fourth pixel 114 in each of which green light is condensed, the second pixel corresponding region 132 corresponding to the second pixel 112 in which blue light is condensed, and the third pixel corresponding region 133 corresponding to the third pixel corresponding region 133 in which red light is condensed.

The color separation lens array 130 includes a plurality of nanoposts NP and a peripheral material EN located around and on side surfaces of the plurality of nanoposts NP. The peripheral material EN is formed of a material having a different refractive index from a refractive index of a material of the plurality of nanoposts NP, and thus forms a difference in refractive index between the nanoposts NP.

The plurality of nanoposts NP are divided and arranged in the first, second, third, and fourth pixel corresponding regions 131, 132, 133, and 134. That is, a plurality of nanoposts NP may be disposed in each of the first, second, third, and fourth pixel corresponding regions 131, 132, 133, and 134, and, based on the shapes and arrangement of the nanoposts NP in each of the first, second, third, and fourth pixel corresponding regions 131, 132, 133, incident light may be separated according to wavelengths and may be condensed on the first, second, third, and fourth pixels 111, 112, 113, and 114.

According to an example embodiment, the nanoposts NP included in the color separation lens array 130 may include multiple types of nanoposts. The nanoposts NP include main posts MP each having a greater refractive index than a refractive index of the peripheral material EN and sub-posts SP each having a smaller refractive index than the refractive index of the peripheral material EN. Given that the refractive index of the peripheral material EN is n1, the refractive index of the main post MP is n2, and the refractive index of the sub-post SP is n0, a relationship of n2>n1>n0 may be satisfied. The sub-post SP may be an air-hole that is a hole filled with air and surrounded by the peripheral material EN. However, embodiments are not limited thereto, and the sub-post SP may be formed of a material with a refractive index of 1 or a value close to 1. Some of the sub-posts SP may be air holes, or may be air holes filled with a low refractive index material.

By including various types of nanoposts NP, for example, main posts MP and sub-posts SP, the color separation performance of the color separation lens array 130 may be further improved. In the following description, for common configurations between a main post MP and a sub-post SP, they may collectively be referred to as a nanopost NP.

Since the refractive index of a material varies according to the wavelength of light that reacts with the material, the color separation lens array 130 may provide different phase profiles for light of different wavelengths. For example, because a refractive index of even the same material varies according to the wavelength of light reacting with the material and a phase delay experienced by light when the light has passed through the material also varies according to the wavelength, different phase profiles may be formed for different wavelengths. For example, because a refractive index of the first pixel corresponding region 131 with respect to first wavelength light may be different from a refractive index of the first pixel corresponding region 131 with respect to second wavelength light, and a phase delay experienced by the first wavelength light that has passed through the first pixel corresponding region 131 may be different from a phase delay experienced by the second wavelength light that has passed through the first pixel corresponding region 131, when the color separation lens array 130 is configured by taking these characteristics of light into consideration, different phase profiles may be provided for the first wavelength light and the second wavelength light.

The plurality of nanoposts NPs included in the color separation lens array 130 may be arranged according to a specific rule to form different phase profiles for light beams of a plurality of wavelengths. Herein, the rule may be applied to parameters such as the shapes, sizes (widths and heights), spacing, and arrangement form of the nanoposts NPs, and these parameters may be determined according to a phase profile for each color to be implemented through the color separation lens array 130.

The nanopost NP may have a subwavelength's geometric dimension. Here, the sub-wavelength refers to a wavelength smaller than the wavelength band of light that is incident on the nanopost NP to be branched. For example, the nanopost NP may have a cylindrical shape having a subwavelength's cross-section diameter. However, the shape of the nanopost NP is not limited thereto, and may be in the shape of, for example, an elliptical pillar or polygonal pillar. The nanoposts NPs may be posts having other, symmetrical, or asymmetric cross-sectional shapes. The nanoposts NP are each shown as having constant widths perpendicular to a height direction (Z direction), that is, are shown in a rectangular shape having a cross-section parallel to the height direction, but this is an example. Unlike what is shown in FIGS. 3A and 3B, the nanoposts NP may have constant widths perpendicular to the height direction, and, for example, the shape of a cross-section parallel to the height direction may be a trapezoid or an inverted trapezoid. When incident light is visible light, for example, the diameter of the cross-section of the nanopost NP may have a dimension smaller than 400 nm, 300 nm, or 200 nm. The height of the nanopost NP may be 500 nm to 1500 nm, and may be greater than the diameter of the cross-section of the nanopost NP. The height of the nanoposts NPs may range from a sub-wavelength to several times a wavelength of light. For example, the height of the nanoposts NP may be 5 times or less, 4 times or less, or 3 times or less of the center wavelength of a wavelength band in which the color separation lens array 130 branches.

In FIGS. 3A and 3B, the nanoposts NP are arranged separately in the first lens layer LE1 and the second lens layer LE2. However, this is an example, and the nanoposts NP may be arranged in a single layer or in three or more layers. The nanoposts NP arranged in the first lens layer LE1 and those arranged in the second lens layer LE2 are all shown as having the same height, but embodiments are not limited thereto. The nanoposts NPs located in the first lens layer LE1 may all have the same height, and the nanoposts NP located in the second lens layer LE2 may have the same height, which is different from the height of the nanoposts NP of the first lens layer LE1. According to another example embodiment, different heights may be applied even within the same layer. Details of the nanopost NP may be determined by considering detailed process conditions, along with a phase profile for color separation.

A space between nanoposts NP may be filled with the peripheral material EN that has a different refractive index from a refractive index the nanoposts NP. The peripheral material EN may be the same material or different materials in the first lens layer LE1 and the second lens layer LE2. The nanopost NP may be formed of a material that has a different refractive index from the peripheral material EN. The material of the nanopost NP may be the same material or different materials in the first lens layer LE1 and the second lens layer LE2. The nanopost NP may include c-Si, p-Si, a-Si, III-V compound semiconductors (gallium phosphide (GaP), gallium nitride (GaN), gallium arsenide (GaAs), etc.), silicon carbide (SiC), titanium oxide (TiO2), silicon nitride (SiN), and/or a combination thereof. The nanopost NP having a difference in refractive index from the peripheral material EN may change the phase of light passing through the nanopost NP. This is due to phase delay caused by the sub-wavelength's shape dimensions of nanoposts NP, and the degree of the phase delay is determined by the detailed shape dimensions and arrangement form of the nanoposts NP.

The peripheral material EN may include silicon oxide ($SiO_2$). However, this is an example, and the materials of the nanoposts NP and the peripheral material EN may be set such that, among the nanopost NP, the main post MP has a higher refractive index than a refractive index of the peripheral material EN and the sub-post SP has a lower refractive index than a refractive index of the peripheral material EN.

A transparent spacer layer 120 may be disposed between the semiconductor substrate 110 and the color separation lens array 130. The spacer layer 120 may support the color separation lens array 130, and may form a distance between the sensor substrate 110 and the color separation lens array 130, that is, a thickness d that satisfies distance requirements between the upper surface of the sensor substrate 110 and the lower surface of the color separation lens array 130.

The spacer layer 120 is formed of a material that is transparent to visible light, for example, a dielectric material having a lower refractive index than the refractive index of the nanoposts NP and a relatively low absorption rate in a visible light band, such as $SiO_2$ or silanol-based glass (e.g., siloxane-based spin on glass (SOG)). The spacer layer 120 may be formed of a material with a lower refractive index than the refractive index of the main post MP, or may be formed of the same material as the peripheral material EN.

An etch stop layer ES may be disposed between the first lens layer LE1 and the second lens layer LE2. The etch stop layer ES may be provided to prevent damage to the first lens layer LE1 during a process of manufacturing the second lens layer LE2. When the second lens layer LE2 is formed on the first lens layer LE1, after a material layer to be formed as the peripheral material EN is deposited, a process of etching the material layer to a predetermined depth is performed to form the nanopost NP located in the second lens layer LE2. At this time, the first lens layer LE1 may be damaged due to etching to a desired depth or greater, and, when the height of the first lens layer LE1 does not meet a desired height requirement, color separation performance may be deteriorated. The etch stop layer ES formed on the first lens layer LE1 is formed of a material with a lower etch selectivity than the material layer to be etched, and thus may not be completely removed and partially remain during the etching process, thereby preventing damage to the first lens layer LE1. The etch stop layer ES may include, for example, hafnium oxide ($HfO_2$). A thickness of the etch stop layer ES may be determined by considering an etch depth, that is, the height of the second lens layer LE2, and may also be determined by considering an etch distribution within a process wafer. The etch stop layer ES may have a thickness of about 3 nm to about 30 nm.

An etch stop layer may be disposed between the spacer layer 120 and the first lens layer LE1. Similar to the etch stop layer ES, this etch stop layer may also be provided to protect the spacer layer 120, which is a lower structure of the color separation lens array 130, in a manufacturing process of the color separation lens array 130. When the first lens layer LE1 is manufactured on the spacer layer 120, after a material layer to be formed as the peripheral material EN is deposited, a process of etching the material layer to a predetermined depth is performed to form the nanopost NP that is to be located in the first lens layer LE1. At this time, the spacer layer 120 may be damaged as the material layer is etched to more than a desired depth, and when the thickness of the spacer layer 120 does not meet a requirement for a distance between the color separation lens array 130 and the sensor substrate 110, color separation performance may be deteriorated. The etch stop layer is formed of a material with a lower etch selectivity than the material layer to be etched, and thus is not easily removed during the etching process and remains, thereby preventing damage to the spacer layer 120 from the etching process. The etch stop layer may include, for example, $HfO_2$. A thickness of the etch stop layer may be determined by considering an etch depth, that is, the height of the first lens layer LE1, and may also be determined by considering an etch distribution within a process wafer. The etch stop layer may have a thickness of about 3 nm to about 30 nm.

A protective layer that protects the color separation lens array 130 may be further disposed on the color separation lens array 130. The protective layer may be formed of a material that serves as an anti-reflection layer. The anti-reflection layer may improve light use efficiency of the pixel array 1100 by reducing light reflected by the upper surface of the color separation lens array 130 among incident light. For example, the anti-reflection layer helps light incident from the outside onto the pixel array 1100 to be not reflected on the upper surface of the color separation lens array 130 and pass through the color separation lens array 130 and thus be detected by the sensor substrate 110. The anti-reflection layer may have a structure in which one or more layers are stacked, for example, a structure including one layer formed of a different material from the material used to form the second lens layer LE2 or including a plurality of material layers with different refractive indices.

According to an example embodiment, the shapes, materials, and arrangement of the plurality of nanoposts NP distributed in each of the first, second, third, and fourth pixel corresponding regions 131, 132, 133, and 134 of the color separation lens array 130 are set to form a desired phase profile for each color, and to further improve color separation performance.

The sub-post SP formed of a material with a lower refractive index than the refractive index of the peripheral material EN may complement the color separation performance that appears when the color separation lens array 130 is implemented with only the main posts MP, and the number of sub-posts SP provided may be less than the number of main posts MP.

Regarding FIGS. 4A and 4B, most of the sub-posts SP are arranged in the second pixel corresponding region 132, and the sub-posts SP are not arranged in the first pixel corresponding region 131, the third pixel corresponding region 133, and the fourth pixel corresponding region 134 or are arranged in a relatively small number. However, this is merely an example, and embodiments are not limited thereto.

A distribution or number of the sub-posts SP may be described as a relative ratio with respect to a distribution or number of the main posts MP in each of the first, second, third, and fourth pixel corresponding regions 131, 132, 133, and 134.

In respective cross-sections of the first, second, third, and fourth pixel corresponding regions 131, 132, 133, and 134, for example, cross-sections perpendicular to the Z direction in which the sensor substrate 110 is spaced apart from the color separation lens array 130, ratios of a sum of the respective areas of the sub-posts SPs to a sum of the respective areas of the main posts MPs may be defined as first, second, third, and fourth fill factors, respectively. For example, the first fill factor refers to the fill factor of the sub-posts SP with respect to the main posts MP in the first pixel corresponding region 131, the second fill factor refers to the fill factor of the sub-posts SP with respect to the main posts MP in the second pixel corresponding region 132, the third ill factor refers to the fill factor of the sub-posts SP with respect to the main posts MP in the third pixel corresponding region 133, and the fourth fill factor refers to the fill factor of the sub-posts SP with respect to the main posts MP in the fourth pixel corresponding region 134.

Among the first, second, third, and fourth fill factors, the second fill factor may be the largest. For example, the fill factor of sub-posts SP in the second pixel corresponding region 132, which is a blue pixel corresponding region, may be the largest.

For example, the second fill factor may be greater than 1, and the number of sub-posts SP in the second pixel corresponding region 132 may be greater than the number of main posts MP in the second pixel corresponding region 132. However, this is merely an example, and embodiments are not limited thereto.

Two or more sub-posts may be arranged in the second pixel corresponding region 132, and, among two sub-posts, a sub-post SP located farther from the center of the second pixel corresponding region 132 may have a less cross-sectional size than another sub-post SP.

Among the first, second, third, and fourth fill factors, the third fill factor may be the smallest. For example, the fill factor of sub-posts SP in the third pixel corresponding region 133, which is a red pixel corresponding region, may be the smallest. The distribution or number of the sub-posts SP located in each of the first pixel corresponding region 131, the third pixel corresponding region 133, and the fourth pixel corresponding region 134 may be greater in a peripheral area than the distribution or number of the main posts MP within the corresponding pixel corresponding region.

The first fill factor, the third fill factor, and the fourth fill factor may be 0. For example, the first pixel corresponding region 131, the third pixel corresponding region 133, and the fourth pixel corresponding region 134 may not include sub-posts SP.

The above-described first, second, third, and fourth fill factors may be defined in each of the first lens layer LE1 and the second lens layer LE2. The above descriptions of the arrangement positions and shapes of the sub-posts SP may be applied to both the first lens layer LE1 and the second lens layer LE2 or to at least one of the first lens layer LE1 and the second lens layer LE2.

Referring to FIG. 4A, in the second lens layer LE2, the sub-posts SP may be arranged only in the second pixel corresponding region 132 among the first, second, third, and fourth pixel corresponding regions 131, 132, 133, and 134, and may not be arranged in the first, third, and fourth pixel corresponding regions 131, 133, and 134. The first fill factor, the third fill factor, and the fourth fill factor may be 0.

In the second pixel corresponding region 132, the sub-posts SP may be distributed in a peripheral area relatively, compared to the distribution or number of the main posts MP. For example, the main posts MP may be located at the exact center of the second pixel corresponding region 132. In the second pixel response region 132, sub-posts SP with large cross-sectional sizes among the plurality of sub-posts SP may be located relatively in the center area near the center of the second pixel corresponding region 132, and main posts MP with large cross-sectional sizes among the plurality of main posts MP may be located relatively in the center area. The number of sub-posts SP in the second pixel corresponding region 132 may be greater than the number of main posts MP in the second pixel corresponding region 132, and the second fill factor may be greater than 1. The second fill factor may be 1.5 or more or 2 or more, but embodiments are not limited thereto.

Referring to FIG. 4B, in the first lens layer LE1, the sub-posts SP may be provided in all of the first, third, and fourth pixel corresponding regions 131, 132, 133, and 134.

Among the first, third, and fourth fill factors, the second fill factor is the largest, that is, the first fill factor, the third fill factor, and the fourth fill factor are all smaller than the second fill factor. The first fill factor, the third fill factor, and the fourth fill factor may be less than 1 and may be relatively small values close to 0, for example, may be less than 0.5 or may be 0.2 or less. However, embodiments are not limited thereto.

In each of the first pixel corresponding region 131, the third pixel corresponding region 133, and the fourth pixel corresponding region 134, the number of sub-posts SP is less than the number of main posts MP. In each of the first pixel corresponding region 131, the third pixel corresponding region 133, and the fourth pixel corresponding region 134, the sub-posts SP may be distributed relatively greater in the peripheral area, compared to the distribution or number of main posts MP. As shown in FIG. 4B, the sub-posts SP in each of the first pixel corresponding region 131, the third pixel corresponding region 133, and the fourth pixel corresponding region 134 may be arranged at an outermost perimeter of each of the first pixel corresponding region 131, the third pixel corresponding region 133, and the fourth pixel corresponding region 134. However, the illustrated location is merely an example, and embodiments are not limited thereto.

Even in the second pixel corresponding region 132 of the first lens layer LE1, the distribution or number of the sub-posts SP may be greater in a peripheral area compared to the distribution or number of the main posts MP. For example, the main posts MP may be located at the exact center of the second pixel corresponding region 132. In the second pixel response region 132, sub-posts SP with relatively large cross-sectional sizes among the plurality of sub-posts SP may be located relatively in the center area, and main posts MP with large cross-sectional sizes among the plurality of main posts MP may be located relatively in the center area. The number of sub-posts SP in the second pixel corresponding region 132 may be greater than the number of main posts MP in the second pixel corresponding region 132, and the second fill factor may be greater than 1. The second fill factor may be 1.5 or more or 2 or more, but embodiments are not limited thereto.

Figure 5A:
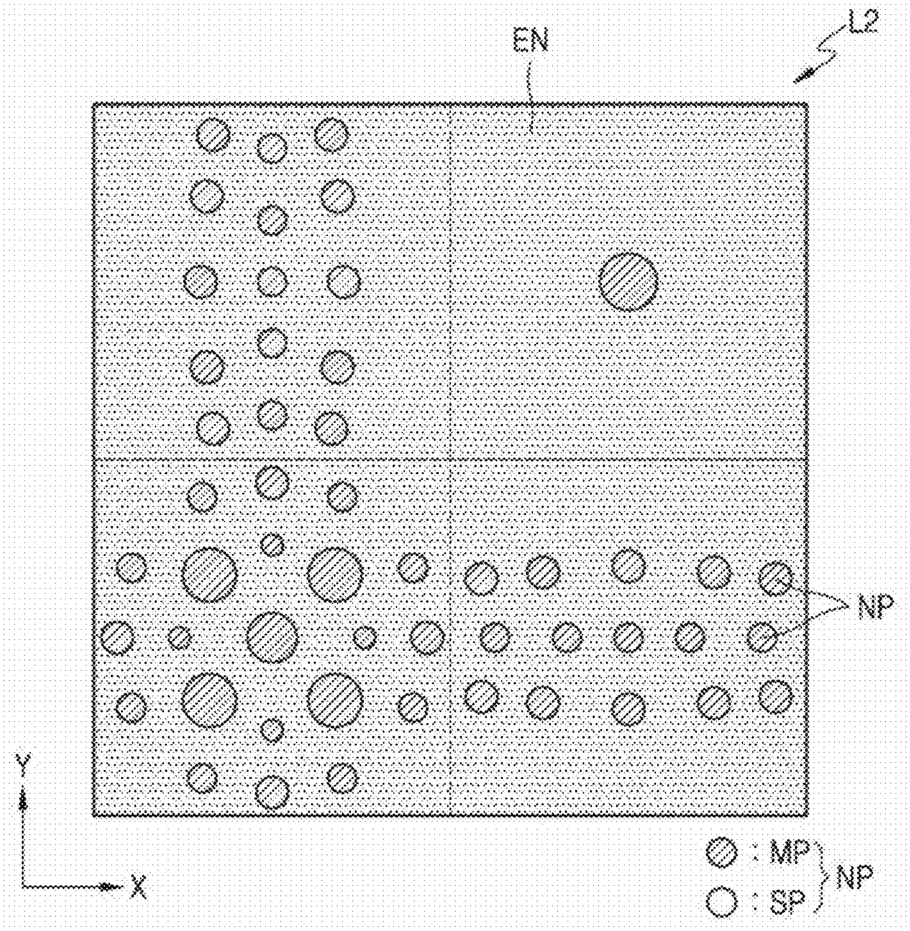
FIGS. 5A and 5B illustrate an arrangement form of nanoposts of a color separation lens array included in a pixel array of an image sensor according to a related example, and are plan views showing a second lens layer and a first lens layer, respectively.
Figure 5B:
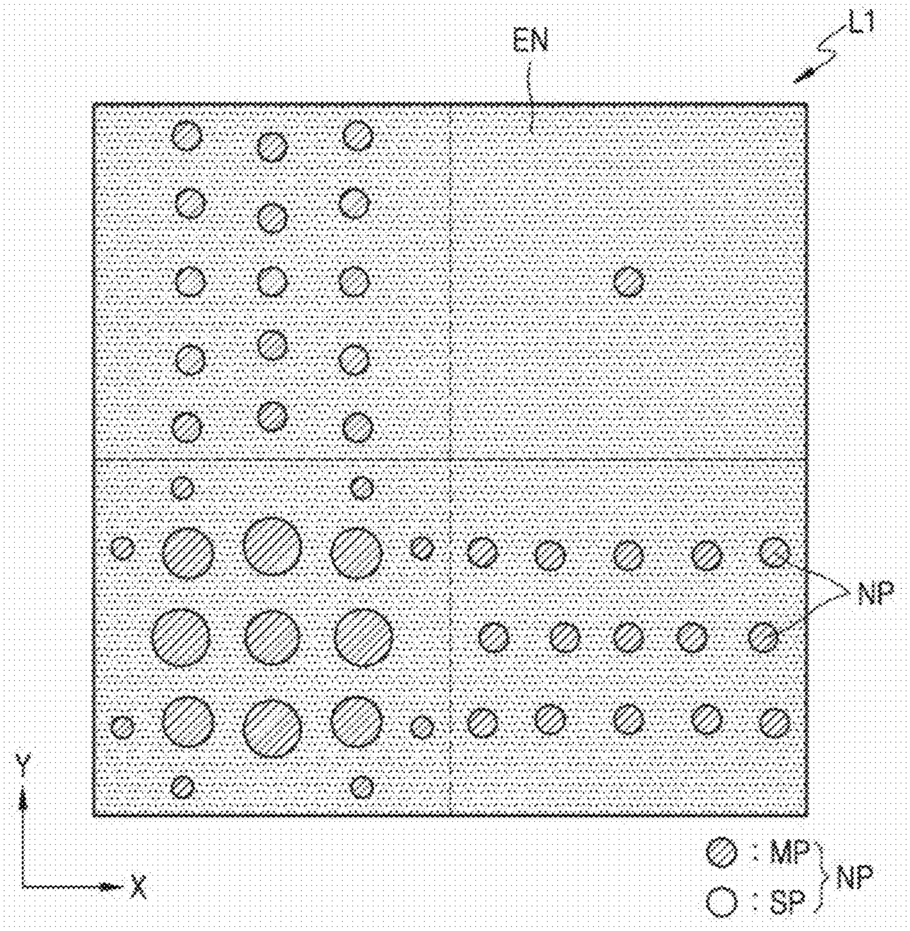

FIGS. 5A and 5B illustrate an arrangement form of nanoposts of a color separation lens array included in a pixel array of an image sensor according to a related example, and are plan views showing a second lens layer and a first lens layer, respectively.

Referring to FIGS. 5A and 5B, the second lens layer L2 and the first lens layer L1 include only one type of nanoposts NP having a higher refractive index than a refractive index of the peripheral material EN. For example, the locations of the sub-posts SP provided in the second lens layer LE2 and the first lens layer LE1 illustrated in FIGS. 4A and 4B may not be included and replaced with the peripheral material EN. In addition, each of the first pixel corresponding region 131, the third pixel corresponding region 133, and the fourth pixel corresponding region 134 may include a different number and arrangement of the main posts MP.

Figure 6:
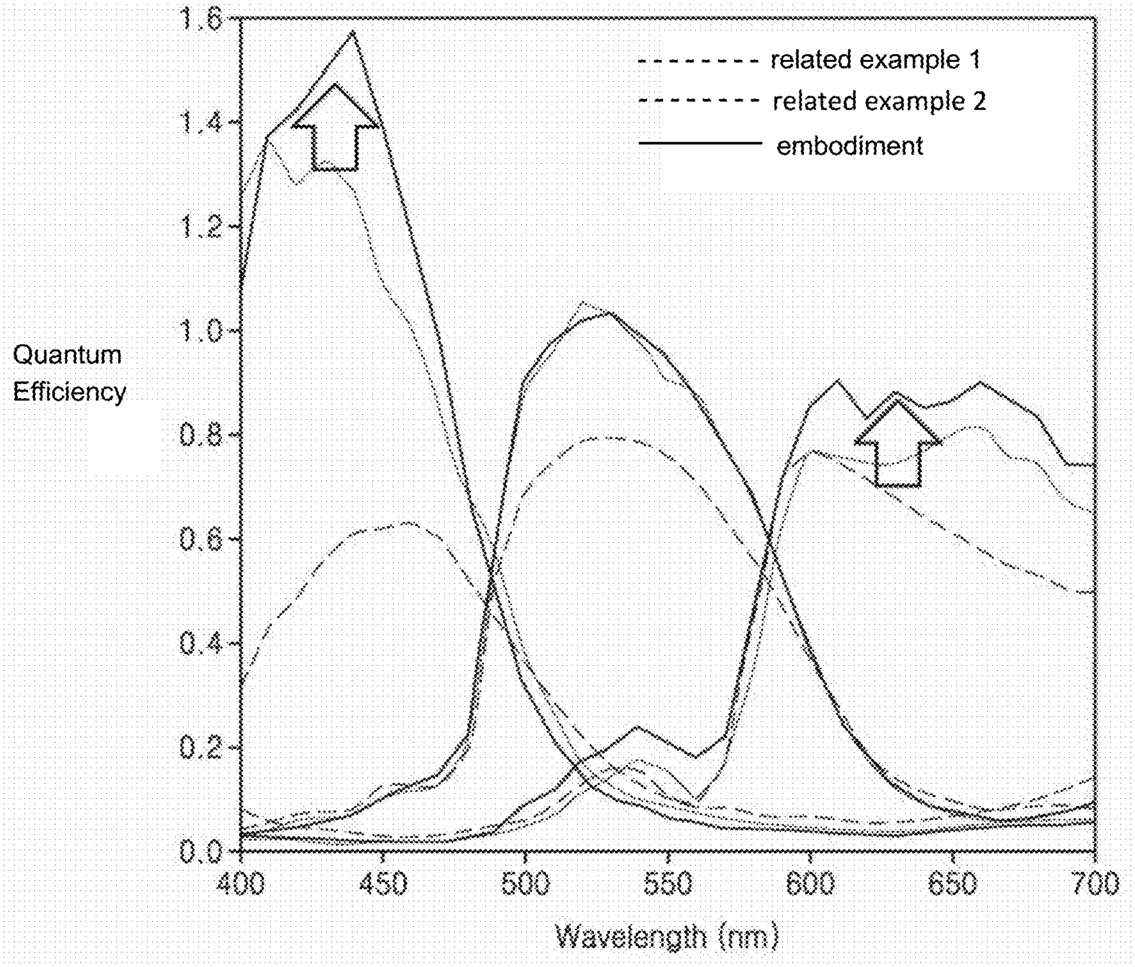
FIG. 6 is a graph showing a comparison between color separation performance of an image sensor according to an example embodiment and color separation performance of an image sensor according to a related example.

FIG. 6 illustrates graphs showing a comparison between color separation performance of an image sensor according to an example embodiment and color separation performance of an image sensor according to related examples 1 and 2.

In FIG. 6, a graph depicted with a dotted line represents a quantum efficiency (QE) of an image sensor that does not include a color separation lens according to a related example 1. A graph depicted with a thin solid line represents a QE of an image sensor including a color separation lens according to a related example 2. A graph depicted with a thick solid line represent a QE of an image sensor according to an example embodiment in which sub-posts SP are air holes, main posts MP include $TiO_2$, and a peripheral material EN includes $SiO_2$, and the related example 2 is a case where a peripheral material EN includes $SiO_2$ and nanoposts NP include $TiO_2$. For example, the image sensor in the related example 2 may include only one type of nanoposts NP including $TiO_2$, whereas the image sensor according to the example embodiment may include two types of nanoposts NP including main posts MP that include $TiO_2$ and sub-posts SP that include $SiO_2$. Referring to the graphs shown in FIG. 6, in the case of the example embodiment provided with sub-posts, color separation performance appears to be improved, compared to the related examples 1 and 2.

Figure 7:
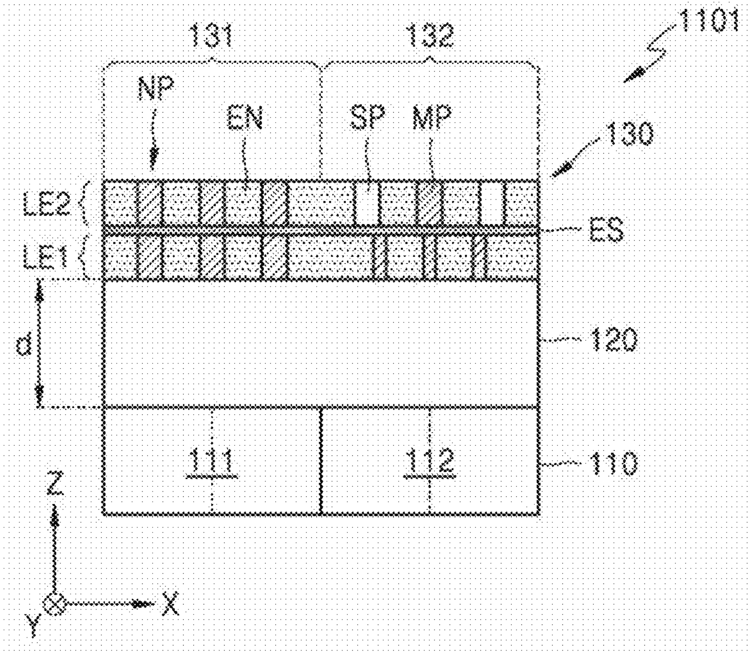
FIG. 7 is a cross-sectional view of a pixel array of an image sensor according to another example embodiment.
Figure 8A:
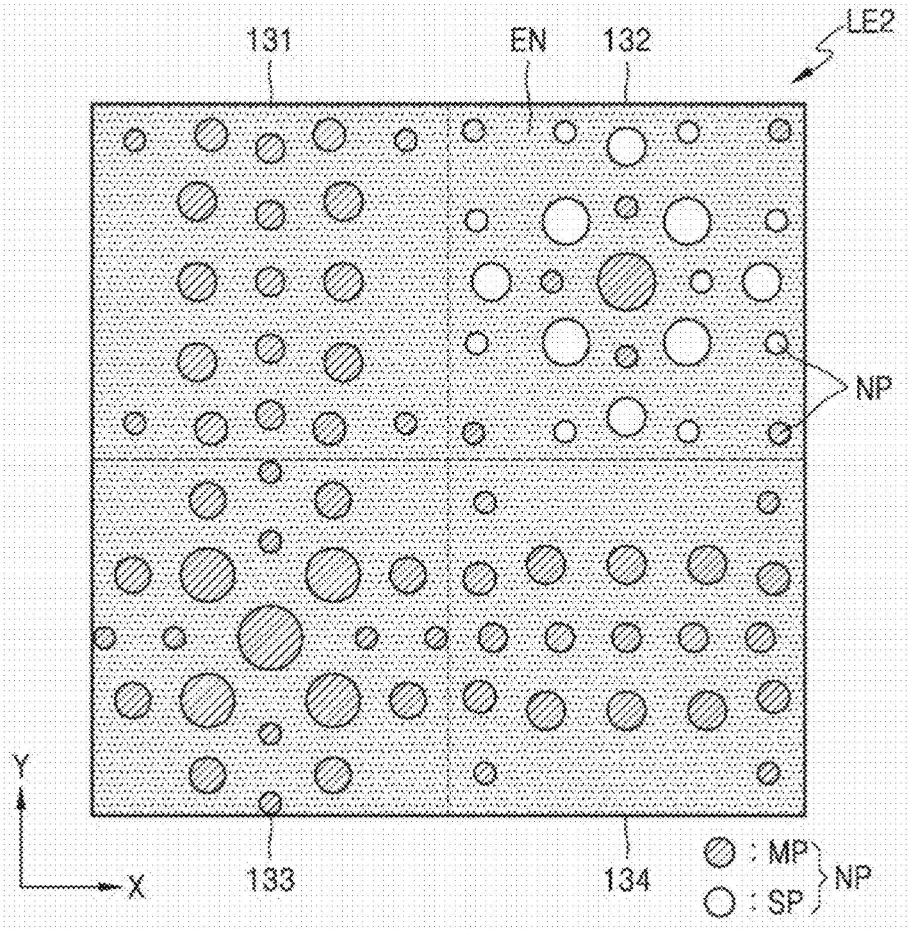
FIGS. 8A and 8B are plan views of color separation lens arrays included in a pixel array of FIG. 7 shown in a second lens layer and a first lens layer, respectively.
Figure 8B:
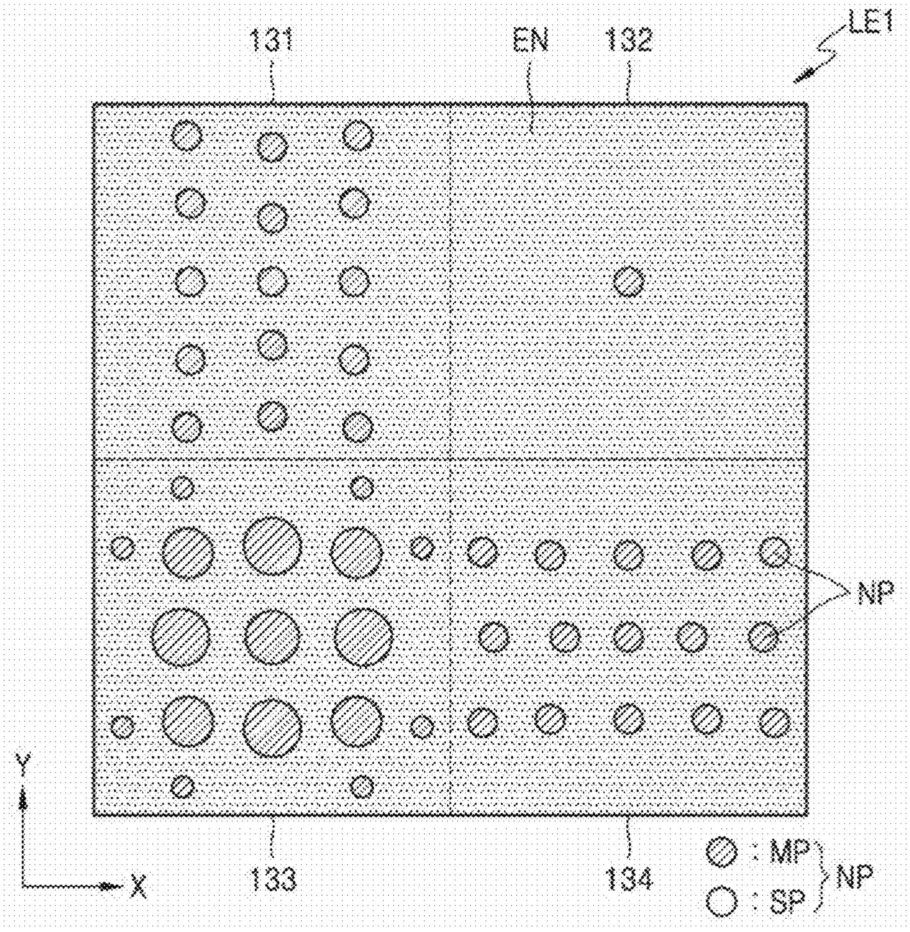

FIG. 7 is a cross-sectional view showing a pixel array of an image sensor according to another example embodiment, and FIGS. 8A and 8B are plan views of color separation lens arrays included in a pixel array of FIG. 7 shown in a second lens layer and a first lens layer, respectively.

In a color separation lens array 130 of a pixel array 1101 according to the present embodiment, sub-posts SP are disposed only in a second lens layer LE2 and not in a first lens layer LE1, in contrast with the previous embodiment.

The sub-posts SP located in the second lens layer LE2 are positioned so that a second fill factor is the largest, that is, a fill factor of sub-posts SP in a second pixel corresponding region 132 among first, second, third, and fourth pixel corresponding regions 131, 132, 133, and 134 is the largest.

In FIG. 8A, it is shown that sub-posts SP are not arranged in the first pixel corresponding region 131, the third pixel corresponding region 133, and the fourth pixel corresponding region 134. However, this is merely an example, and embodiments are not limited thereto. Sub-posts SP may also be included in the first pixel corresponding region 131, the third pixel corresponding region 133, and the fourth pixel corresponding region 134 to have a smaller fill factor than the second fill factor.

According to another example embodiment, the sub-posts SP may not be included in the second lens layer LE2 but may be included only in the first lens layer LE1.

Figure 9:
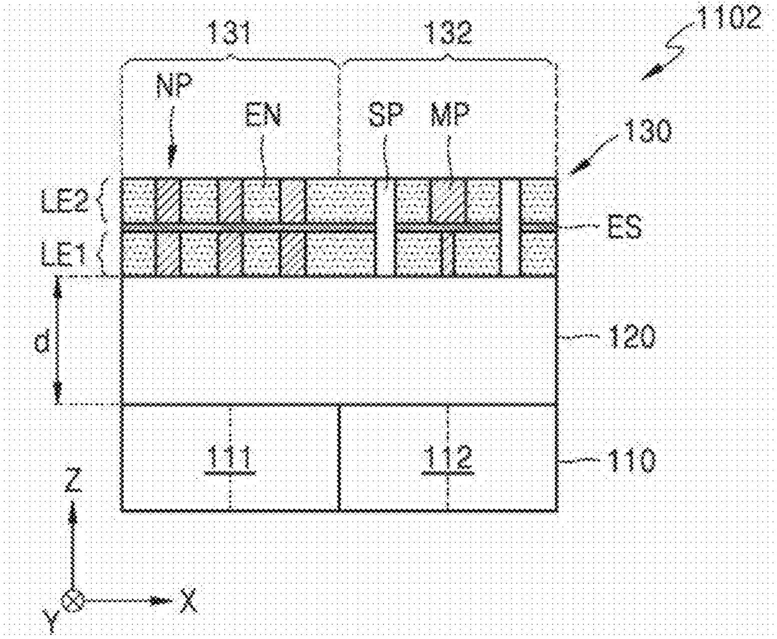
FIG. 9 is a cross-sectional view of a pixel array of an image sensor according to another example embodiment.

FIG. 9 is a cross-sectional view of a pixel array of an image sensor according to another example embodiment.

A pixel array 1102 according to the example embodiment is different from the previous example embodiments in that sub-posts SP in a first lens layer LE1 are connected to sub-posts SP in a second lens layer LE2 through an etch stop layer ES.

When the sub-posts SP is in the form of air holes, the sub-posts SP provided in the second lens layer LE2 and the sub-posts SP provided in the first lens layer LE1 may be formed at the same time. This structure may be more convenient to form during a manufacturing process. The sub-posts SP facing each other between the first lens layer LE1 and the second lens layer LE2 may be connected in this way, but this does not indicate that all of the provided sub-posts SP have this form. For example, different types of sub-posts SP may be located in the first lens layer LE1 or the second lens layer LE2.

Figure 10:
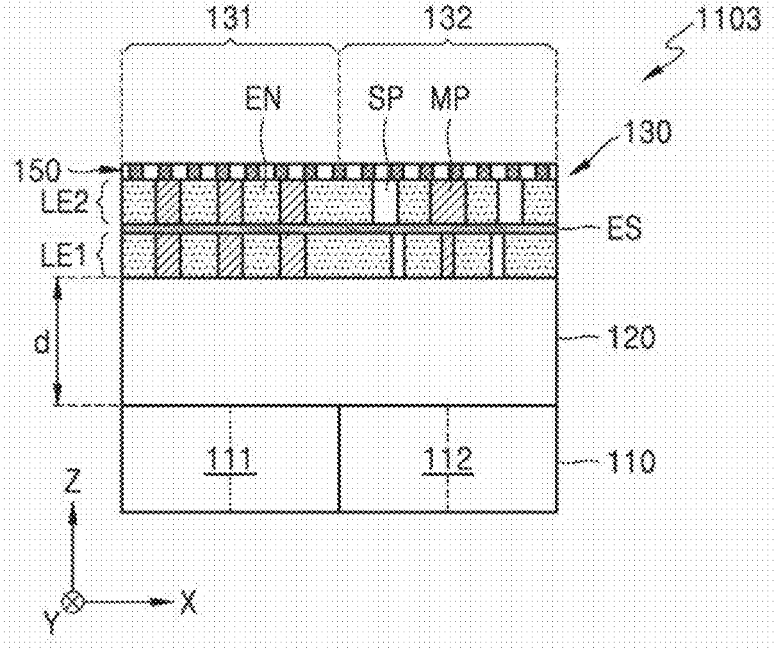
FIG. 10 is a cross-sectional view of a pixel array of an image sensor according to another example embodiment.
Figure 11:
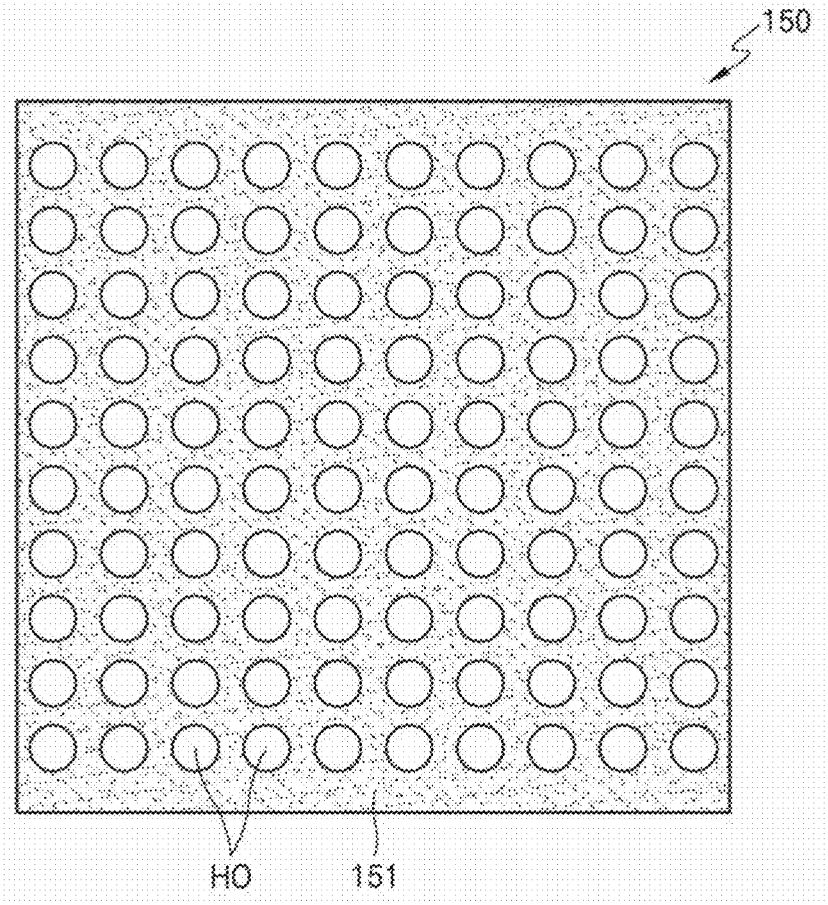
FIG. 11 is a plan view of an anti-reflection layer included in the pixel array of FIG. 10.

FIG. 10 is a cross-sectional view showing a pixel array of an image sensor according to another example embodiment, and FIG. 11 is a plan view of an anti-reflection layer included in the pixel array of FIG. 10.

A pixel array 1103 according to the example embodiment is different from the previous example embodiments in that an anti-reflection layer 150 disposed on a light-receiving surface of a color separation lens array 130 is further included.

The anti-reflection layer 150 may reduce light loss that occurs when light incident on the color separation lens array 130 is reflected. To this end, an average refractive index of the anti-reflection layer 150 may be greater than the refractive index of air and less than an average refractive index of the color separation lens array 130.

The anti-reflection layer 150 may have a patterned structure to include a plurality of holes HO periodically arranged two-dimensionally. For example, the anti-reflection layer 150 may include a dielectric layer 151 that is transparent to visible light, and a plurality of holes HO penetrating through the dielectric layer 151 in a third direction (Z direction). The dielectric layer 151 may include, for example, at least one material selected from aluminum oxide (AlO), HfO, SiN, $SiO_2$, AlOC, AlON, and AlOCN, or a combination thereof. According to another example embodiment, besides the aforementioned materials, the dielectric layer 151 may also include another inorganic material having a refractive index of 1 or more and 3 or less. Respective diameters of the plurality of holes HO and an arrangement period thereof may have smaller dimensions than the wavelength of visible light, in particular, blue light. For example, the arrangement period of the plurality of holes HO may be about 300 nm or less, and respective widths or diameters of the plurality of holes HO may be about 300 nm or less.

Figure 12:
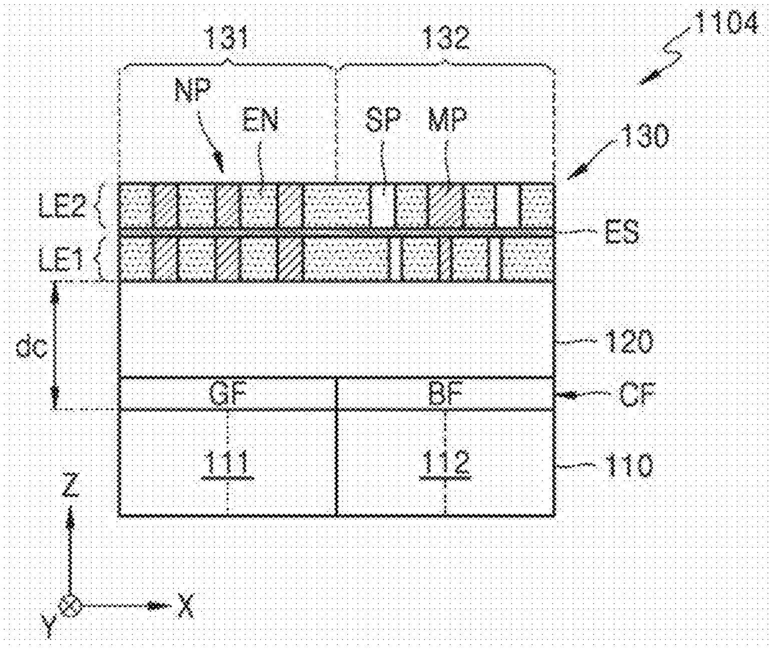
FIG. 12 is a cross-sectional view of a pixel array of an image sensor according to another example embodiment.

FIG. 12 is a cross-sectional view of a pixel array of an image sensor according to another example embodiment.

A pixel array 1104 according to the example embodiment is different from the previous example embodiments in that a color filter array CF is further disposed between a color separation lens array 130 and a sensor substrate 110.

The color filter array CF includes a green filter GF, a blue filter BF, a red filter, and a green filter respectively corresponding to first, second, third, and fourth pixels 111, 112, 113, and 114 arranged as illustrated in FIG. 2B, and FIG. 12 is a cross-sectional view corresponding to the cross-section of FIG. 3A.

Because light branched for each wavelength by the color separation lens array 130 is incident on the color filter array CF, a decrease in luminous efficiency due to the color filter array CF may be very small. The color filter array CF may play a role in improving color purity by compensating for some errors that may appear during color separation by the color separation lens array 130.

A distance dc between the sensor substrate 110 and the color separation lens array 130 may be different from the above-described distance d by considering an effective refractive index due to the color filter array CF.

The green filter GF may transmit light in a green wavelength band among incident light and block light in the other wavelength bands, the blue filter BF may transmit light in a blue wavelength band among the incident light and block light in the other wavelength bands, and the red filter may transmit light in a red wavelength band among the incident light and block light in the other wavelength bands. These color filters may be organic color filters containing organic dyes or organic pigments.

The spacer layer 120 is provided to satisfy appropriate distance requirements between the sensor substrate 110 and the color separation lens array 130, and may also serve as a planarization layer. According to another example embodiment, a separate planarization layer may be further disposed between the color filter array CF and the spacer layer 120.

An upper surface of the color filter array CF is shown as being flat, but this is an example and may not be flat. For example, respective thicknesses of the green filter GF, the blue filter BF, and a black matrix therebetween may not be the same.

The planarization layer may include an organic polymer material that is suitable for being deposited on the color filter array CF formed of an organic material and is easy to form a flat surface. This organic polymer material may have transparent properties with respect to visible light. For example, the planarization layer may include at least one organic polymer material selected from epoxy resin, polyimide, polycarbonate, polyacrylate, and polymethyl methacrylate (PMMA).

In addition to the planarization layer, an encapsulation layer may be further disposed. The encapsulation layer may serve as a protective layer that prevents the planarization layer formed of an organic polymer material from being damaged during a process of forming the color separation lens array 130 on the planarization layer. The encapsulation layer may also serve as an anti-diffusion layer that prevents a metal component of the color filter array CF from passing through the planarization layer and being exposed to the outside due to a high temperature during the process of forming the color separation lens array 130. To this end, the encapsulation layer may include an inorganic material. The inorganic material of the encapsulation layer may be formed at a lower temperature than a process temperature for forming the color separation lens array 130 and may include a material that is transparent to visible light. In order to reduce reflection loss at an interface between the planarization layer and the encapsulation layer, it is advantageous for the refractive index of the encapsulation layer to be similar to that of the planarization layer. For example, a difference between the refractive index of the planarization layer and the refractive index of the encapsulation layer may be within +20% of the refractive index of the planarization layer. For example, the encapsulation layer may include at least one inorganic material among $SiO2$, SiN, and SiON.

The spacer layer 120 may be composed of multiple layers of a planarization layer and an encapsulation layer as described above.

Figure 13:
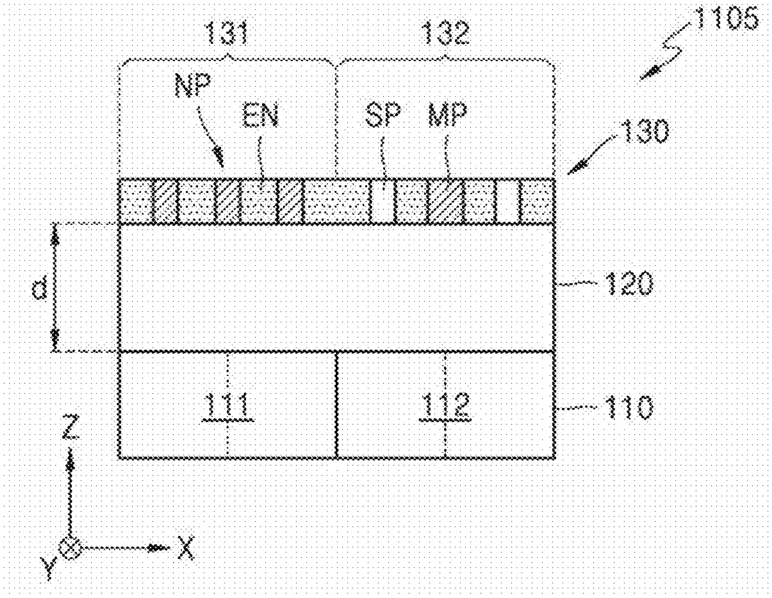
FIG. 13 is a cross-sectional view of a pixel array of an image sensor according to another example embodiment.

FIG. 13 is a cross-sectional view of a pixel array of an image sensor according to another example embodiment.

A pixel array 1105 according to the example embodiment is different from the previous example embodiments in that nanoposts NP included in a color separation lens array 130 are arranged in a single layer.

Similar to the previous example embodiments, the nanoposts NPs include main posts MP with a greater refractive index than the refractive index of the peripheral material EN and sub-posts SP with a less refractive index than the refractive index of the peripheral material EN, and a sub-post fill factor in a second pixel corresponding region 132, that is, a second fill factor, is the largest.

For example, the arrangement of the sub-posts SP described above with reference to FIG. 4A, 4B, or 8A may be similarly applied.

According to the example embodiment in which the nanoposts NP are arranged in a single layer, the height of the nanoposts NP may be greater than when the nanoposts NP are arranged in multiple layers. However, this is merely an example, and embodiments are not limited thereto. The arrangement of the nanoposts NP in a single layer or multiple layers may be selected in consideration of fine performance control or manufacturing of the color separation lens array 130.

Figure 14:
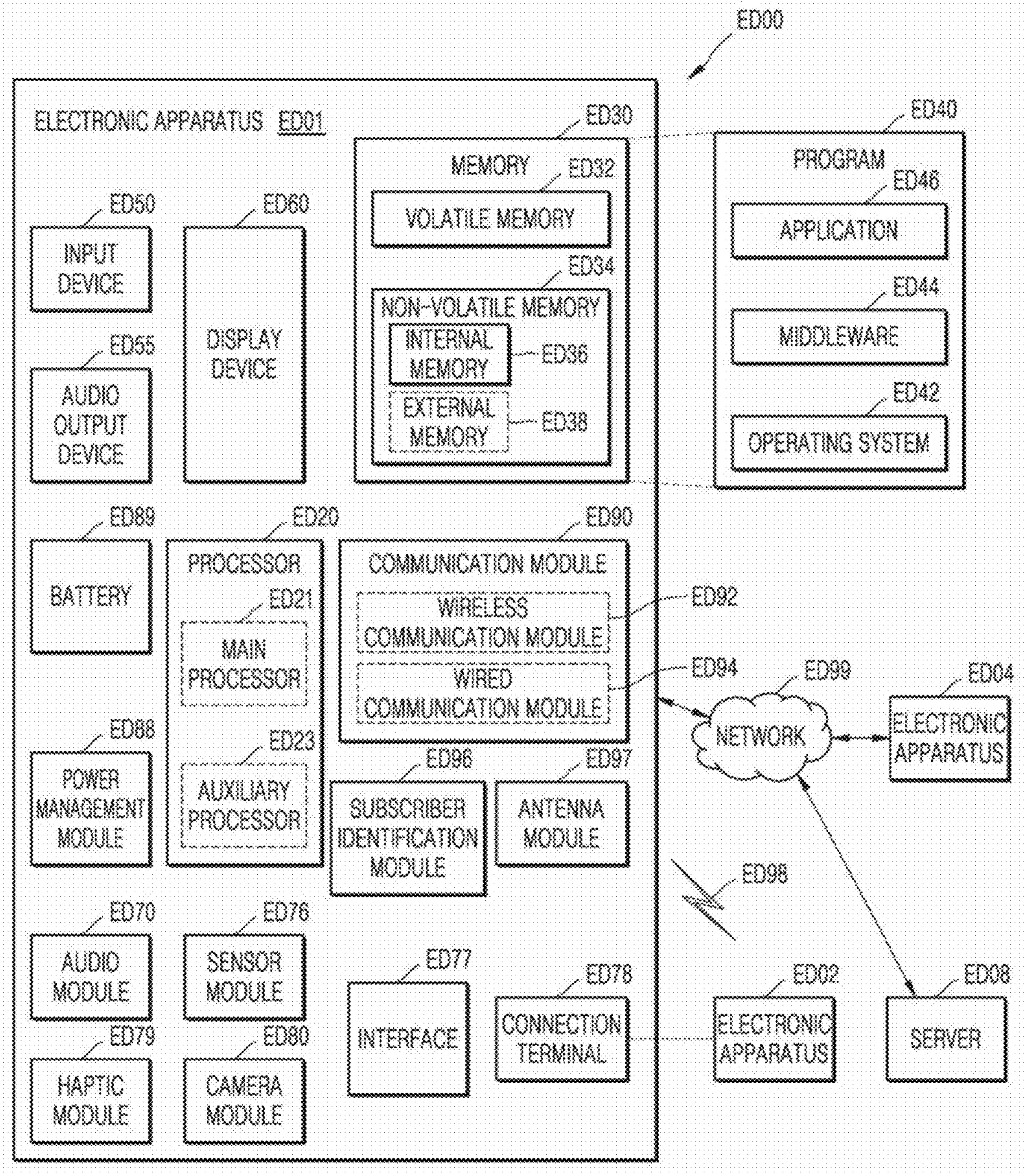
FIG. 14 is a schematic block diagram of an electronic apparatus including an image sensor according to example embodiments.

FIG. 14 is a schematic block diagram of an electronic apparatus ED01 including an image sensor according to embodiments. Referring to FIG. 14, in a network environment ED00, the electronic apparatus ED01 may communicate with another electronic apparatus ED02 through a first network ED98 (short-range wireless communication network, and the like), or communicate with another electronic apparatus ED04 and/or a server ED08 through a second network ED99 (long-range wireless communication network, and the like). The electronic apparatus ED01 may communicate with the electronic apparatus ED04 via the server ED08. The electronic apparatus ED01 may include a processor ED20, a memory ED30, an input device ED50, an audio output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic apparatus ED01, some (display device ED60, etc.) of the aforementioned components may be omitted or other components may be added. Some of the components may be implemented by one integrated circuit. For example, the sensor module ED76 (a fingerprint sensor, an iris sensor, an illuminance sensor, and the like) may be implemented by being embedded in the display device ED60 (a display, and the like).

The processor ED20 may control one or a plurality of other components (hardware and software components, and the like) of the electronic apparatus ED01 connected to the processor ED20 by executing software (a program ED40, and the like), and perform various data processing or calculations. As part of the data processing or calculations, the processor ED20 may load, in a volatile memory ED32, commands and/or data received from other components (the sensor module ED76, the communication module ED90, and the like), process the command and/or data stored in a volatile memory ED32, and store result data in a non-volatile memory ED34. The processor ED20 may include a main processor ED21 (a central processing unit, an application processor, etc.) and an auxiliary processor ED23 (a graphics processing unit, an image signal processor, a sensor hub processor, a communication processor, etc.) that is operable independently of or together with the main processor ED21. The auxiliary processor ED23 may use less power than the main processor ED21 and may perform a specialized function.

Instead of the main processor ED21 when the main processor ED21 is in an inactive state (sleep state), or with the main processor ED21 when the main processor ED21 is in an active state (application execution state), the auxiliary processor ED23 may control functions and/or states related to some components (display device ED60, the sensor module ED76, the communication module ED90, and the like) of the components of the electronic apparatus ED01. The auxiliary processor ED23 (an image signal processor, a communication processor, and the like) may be implemented as a part of functionally related other components (the camera module ED80, the communication module ED90, and the like).

The memory ED30 may store various data needed by the components (the processor ED20, the sensor module ED76, and the like) of the electronic apparatus ED01. The data may include, for example, software (program ED40, etc.) and input data and/or output data about commands related thereto. The memory ED30 may include the volatile memory ED32 and/or the non-volatile memory ED34.

The program ED40 may be stored in the memory ED30 as software, and may include an operating system ED42, middleware ED44, and/or an application ED46.

The input device ED50 may receive commands and/or data to be used for components (processor ED20, etc.) of the electronic apparatus ED01, from the outside (a user, etc.) of the electronic apparatus ED01. The input device ED50 may include a microphone, a mouse, a keyboard, and/or a digital pen (a stylus pen, and the like).

The audio output device ED55 may output an audio signal to the outside of the electronic apparatus ED01. The audio output device ED55 may include a speaker and/or a receiver. The speaker may be used for general purposes such as multimedia playback or recording playback, and the receiver can be used to receive incoming calls. The receiver may be implemented by being coupled as a part of the speaker or by an independent separate device.

The display device ED60 may visually provide information to the outside of the electronic apparatus ED01. The display device ED60 may include a display, a hologram device, or a projector, and a control circuit to control a corresponding device. The display device ED60 may include a touch circuitry set to detect a touch and/or a sensor circuit (a pressure sensor, and the like) set to measure the strength of a force generated by the touch.

The audio module ED70 may convert sound into electrical signals or reversely electrical signals into sound. The audio module ED70 may obtain sound through the input device ED50, or output sound through a speaker and/or a headphone of another electronic apparatus (electronic apparatus ED02, etc.) connected to the audio output device ED55 and/or the electronic apparatus ED01 in a wired or wireless manner.

The sensor module ED76 may detect an operation state (power, temperature, and the like) of the electronic apparatus ED01, or an external environment state (a user state, and the like), and generate an electrical signal and/or a data value corresponding to a detected state. The sensor module ED76 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface ED77 may support one or a plurality of specified protocols used for the electronic apparatus ED01 to be connected to another electronic apparatus (electronic apparatus ED02, etc.) in a wired or wireless manner. The interface ED77 may include a high definition multimedia interface (HDMI), a universal serial bus (USB) interface, an SD card interface, and/or an audio interface.

A connection terminal ED78 may include a connector for the electronic apparatus ED01 to be physically connected to another electronic apparatus (electronic apparatus ED02, etc.). The connection terminal ED78 may include an HDMI connector, a USB connector, an SD card connector, and/or an audio connector (a headphone connector, and the like).

The haptic module ED79 may convert electrical signals into mechanical stimuli (vibrations, movements, and the like) or electrical stimuli that are perceivable by a user through tactile or motor sensations. The haptic module ED79 may include a motor, a piezoelectric device, and/or an electrical stimulation device.

The camera module ED80 may capture a still image and a video. The camera module ED80 may include a lens assembly including one or a plurality of lenses, the above-described image sensor 1000, image signal processors, and/or flashes. The lens assembly included in the camera module ED80 may condense light emitted from a subject for image capturing.

The power management module ED88 may manage power supplied to the electronic apparatus ED01. The power management module ED88 may be implemented as a part of a power management integrated circuit (PMIC).

The battery ED89 may supply power to the components of the electronic apparatus ED01. The battery ED89 may include non-rechargeable primary cells, rechargeable secondary cells, and/or fuel cells.

The communication module ED90 may establish a wired communication channel and/or a wireless communication channel between the electronic apparatus ED01 and another electronic apparatus (the electronic apparatus ED02, the electronic apparatus ED04, the server ED08, and the like), and support a communication through an established communication channel. The communication module ED90 may be operated independently of the processor ED20 (the application processor, and the like), and may include one or a plurality of communication processors supporting a wired communication and/or a wireless communication. The communication module ED90 may include a wireless communication module ED92 (a cellular communication module, a short-range wireless communication module, a global navigation satellite system (GNSS) communication module, and the like), and/or a wired communication module ED94 (a local area network (LAN) communication module, a power line communication module, and the like). Among the above communication modules, a corresponding communication module may communicate with another electronic apparatus through the first network ED98 (a short-range communication network such as Bluetooth, WiFi Direct, or infrared data association (IrDA)) or the second network ED99 (a long-range communication network such as a cellular network, the Internet, or a computer network (LAN, WAN, and the like)). These various types of communication modules may be integrated into one component (a single chip, and the like), or may be implemented as a plurality of separate components (multiple chips). The wireless communication module ED92 may verify and authenticate the electronic apparatus ED01 in a communication network such as the first network ED98 and/or the second network ED99 by using subscriber information (an international mobile subscriber identifier (IMSI), and the like) stored in the subscriber identification module ED96.

The antenna module ED97 may transmit signals and/or power to the outside (another electronic apparatus, etc.) or receive signals and/or power from the outside. An antenna may include an emitter formed in a conductive pattern on a substrate (a printed circuit board (PCB), and the like). The antenna module ED97 may include one or a plurality of antennas. When the antenna module ED97 includes a plurality of antennas, the communication module ED90 may select, from among the antennas, an appropriate antenna for a communication method used in a communication network such as the first network ED98 and/or the second network ED99. Signals and/or power may be transmitted or received between the communication module ED90 and another electronic apparatus through the selected antenna. Other parts (an RFIC, and the like) than the antenna may be included as a part of the antenna module ED97.

Some of the components may be connected to each other through a communication method between peripheral devices (a bus, general purpose input and output (GPIO), a serial peripheral interface (SPI), a mobile industry processor interface (MIPI), and the like) and may mutually exchange signals (commands, data, and the like).

The command or data may be transmitted or received between the electronic apparatus ED01 and the external electronic apparatus ED04 through the server ED08 connected to the second network ED99. The electronic apparatuses ED02 and ED04 may be of a type that is the same as or different from the electronic apparatus ED01. All or a part of operations executed in the electronic apparatus ED01 may be executed in one or a plurality of electronic apparatuses (ED02, ED04, and ED08). For example, when the electronic apparatus ED01 needs to perform a function or service, the electronic apparatus ED01 may request one or a plurality of electronic apparatuses to perform part or the whole of the function or service, instead of performing the function or service. The one or a plurality of electronic apparatuses receiving the request may execute additional function or service related to the request, and transmit a result of the execution to the electronic apparatus ED01. To this end, a cloud computing technology, a distributed computing technology, or a client-server computing technology may be used.

Figure 15:
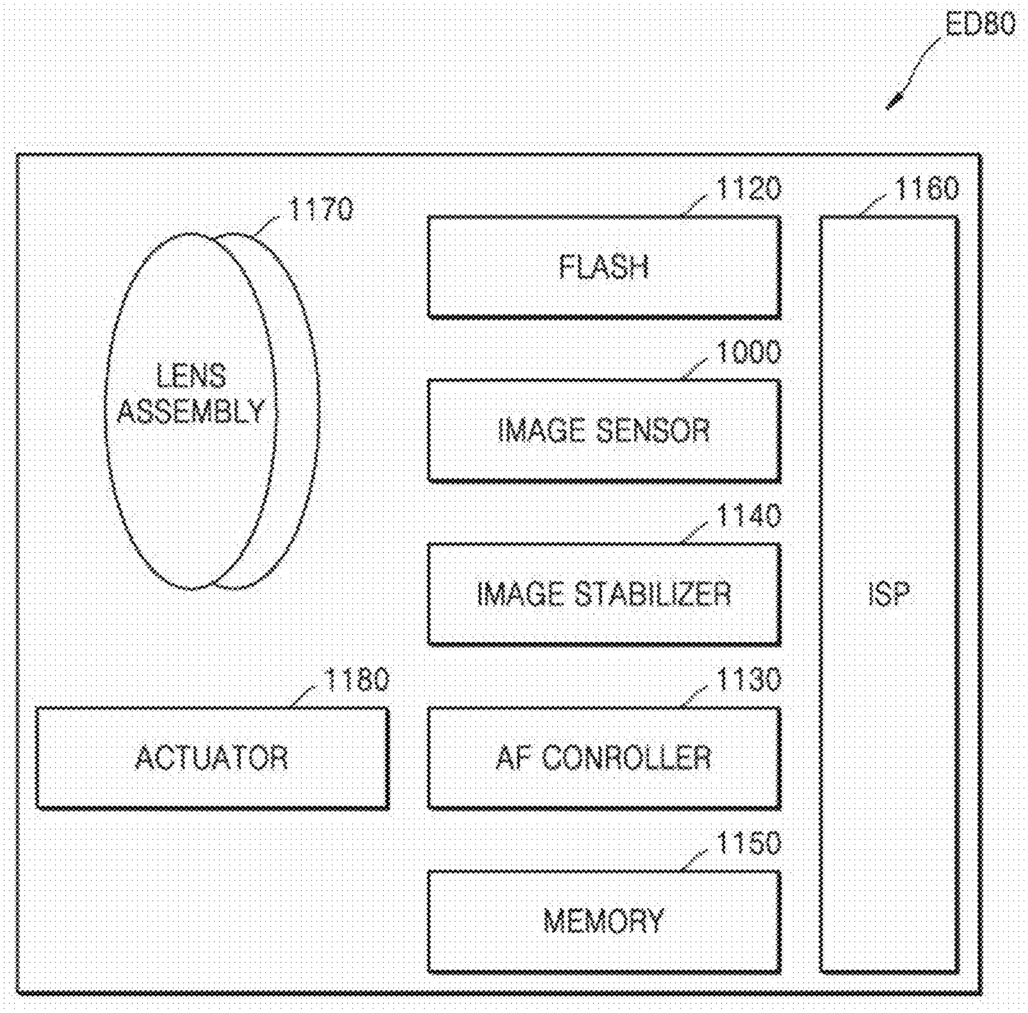
FIG. 15 is a schematic block diagram of a camera module included in the electronic apparatus of FIG. 14.

FIG. 15 is a block diagram of a camera module ED80 included in the electronic apparatus ED01 of FIG. 14. Referring to FIG. 15, the camera module ED80 may include a lens assembly 1170, a flash 1120, an image sensor 1000, an image stabilizer 1140, an AF controller 1130, a memory 1150 (buffer memory, etc.), an actuator 1180, and/or an image signal processor (ISP) 1160.

The lens assembly 1170 may condense light emitted from an object that is to be photographed for image capturing. The lens assembly 1170 may include one or more optical lenses. The lens assembly 1170 may include a path switching member which switches an optical path toward the image sensor 1000. According to whether the path switching member is provided and the arrangement type with the optical lens, the camera module ED80 may have a vertical type or a folded type. The camera module ED80 may include a plurality of lens assemblies 1170, and in this case, the camera module ED80 may be a dual camera, a 360 degrees camera, or a spherical camera. Some of the lens assemblies 1170 may have the same lens attributes (a viewing angle, a focal length, auto focus, F Number, optical zoom, and the like), or different lens attributes. The lens assembly 1170 may include a wide angle lens or a telescopic lens.

The actuator 1180 may drive the lens assembly 1170. For example, at least some of the optical lens and the path switching member included in the lens assembly 1170 may be moved by the actuator 1180. The optical lens may be moved along an optical axis, and, when a distance between adjacent lenses is adjusted by moving at least some of the optical lenses included in the lens assembly 1170, an optical zoom ratio may be adjusted.

The actuator 1180 may adjust the position of any one of the optical lenses included in the lens assembly 1170 so that the image sensor 1000 may be located at the focal length of the lens assembly 1170. The actuator 1180 may drive the lens assembly 1170 according to an AF driving signal transferred from the AF controller 1130.

The flash 1120 may emit light used to enhance light emitted or reflected from the subject. The flash 1120 may emit visible light or infrared-ray light. The flash 1120 may include one or a plurality of light-emitting diodes (a red-green-blue (RGB) LED, a white LED, an infrared LED, an ultraviolet LED, and the like), and/or a xenon lamp.

The image sensor 1000 may be the image sensor 1000 described above with reference to FIG. 1, and may include any one of the pixel arrays 1100, 1101, 1102, 1103, 1104, and 1105 including the above-described various color separation lens arrays, or may include a combined or modified structure thereof. The image sensor 1000 may obtain an image corresponding to the subject by converting the light emitted or reflected by the subject and transferred through the lens assembly 1170 into an electrical signal.

As described above, the image sensor 1000 is equipped with a set color separation lens array of the shapes of nanoposts and the arrangement thereof by utilizing a plurality of types of nanoposts to improve color separation performance, so that an obtained image quality may be improved.

The image stabilizer 1140 may move, in response to a movement of the camera module ED80 or the electronic apparatus ED01 including the same, one or a plurality of lenses included in the lens assembly 1170 or the image sensor 1000 in a particular direction or may compensate for a negative effect due to the movement by controlling (adjustment of a read-out timing, etc.) the movement characteristics of the image sensor 1000. The image stabilizer 1140 may detect a movement of the camera module ED80 or the electronic apparatus ED01 by using a gyro sensor (not shown) or an acceleration sensor (not shown) arranged inside or outside the camera module ED80. The image stabilizer 1140 may be implemented in an optical form.

The AF controller 1130 may generate an AF driving signal from a signal value sensed by an AF pixel of the image sensor 1000. The AF controller 1130 may control the actuator 1180 according to the AF driving signal.

The memory 1150 may store some or entire data of an image obtained through the image sensor 1000 for a subsequent image processing operation. For example, when a plurality of images are obtained at high speed, the obtained original data (Bayer-patterned data, high resolution data, etc.) is stored in the memory 1150 and only low resolution images are displayed. Then, the original data of a selected (user selection, etc.) image may be transferred to the ISP 1160. The memory 1150 may be incorporated into the memory ED30 of the electronic apparatus ED01, or configured to be an independently operated separate memory.

The ISP 1160 may perform image processes on the image obtained through the image sensor 1000 or the image data stored in the memory 1150. The image processes may include depth map generation, 3D modeling, panorama generation, feature point extraction, image synthesis, and/or image compensation (noise reduction, resolution adjustment, brightness adjustment, blurring, sharpening, softening, etc.). The ISP 1160 may perform control (exposure time control, read-out timing control, etc.) on components (image sensor 1000, etc.) included in the camera module ED80. The image processed by the ISP 1160 may be stored again in the memory 1150 for additional processing or provided to external components (e.g., the memory ED30, the display device ED60, the electronic apparatus ED02, the electronic apparatus ED04, the server ED08, and the like) of the camera module ED80. The ISP 1160 may be incorporated into the processor ED20, or configured to be a separate processor operated independently of the processor ED20. When the ISP 1160 is configured by a separate processor from the processor ED20, the image processed by the ISP 1160 may undergo additional image processing by the processor ED20 and then displayed through the display device ED6.

The AF controller 1130 may be integrated with the ISP 1160. The ISP 1160 may generate the AF signal by processing signals from the AF pixels of the image sensor 1000, and the AF controller 1130 may convert the AF signal into a driving signal of the actuator 1180 and transfer the driving signal to the actuator 1180.

The electronic apparatus ED01 may include one or a plurality of camera modules having different attributes or functions. The camera module may include components similar to those of the camera module ED80 of FIG. 14, and the image sensor included in the camera module may be implemented as a charge coupled device (CCD) sensor and/or a complementary metal oxide semiconductor (CMOS) sensor and may include one or a plurality of sensors selected from the image sensors having different properties, such as an RGB sensor, a black and white (BW) sensor, an IR sensor, or a UV sensor. In this case, one of the plurality of camera modules ED80 may be a wide angle camera, and another may be a telescopic camera. Similarly, one of the plurality of camera modules ED80 may be a front side camera, and another may be a rear side camera.

The image sensor 1000 according to example embodiments may be applied to various electronic apparatuses. The image sensor 1000 according to example embodiments may be applied to a mobile phone or a smartphone, a tablet or a smart tablet, a digital camera or a camcorder, a laptop computer, or a television or a smart television. For example, the smartphone or the smart tablet may include a plurality of high resolution cameras, each having a high resolution image sensor mounted thereon. Depth information of subjects in an image may be extracted by using high resolution cameras, out focusing of the image may be adjusted, or subjects in the image may be automatically identified.

Also, the image sensor 1000 may be applied to a smart refrigerator, a surveillance camera, a robot, a medical camera, etc. For example, the smart refrigerator may automatically recognize food in a refrigerator, by using the image sensor 1000 and notify a user of the presence of a particular food, the type of food that is input or output, and the like, through a smartphone. The security camera may provide an ultrahigh resolution image and may recognize an object or a person in an image in a dark environment by using high sensitivity. The robot may be provided in a disaster or industrial site that is not directly accessible by people, and may provide a high resolution image. The medical camera may provide a high resolution image for diagnosis or surgery, and dynamically adjust a field of vision.

Also, the image sensor 1000 may be applied to a vehicle. The vehicle may include a plurality of vehicle cameras arranged on various positions. Each of the vehicle cameras may include an image sensor according to an example embodiment. The vehicle may provide a driver with various pieces of information about the inside or periphery of the vehicle, by using the plurality of vehicle cameras, and may provide information needed for autonomous driving by automatically recognizing an object or a person in an image.

Because a color separation lens array provided in the above-described image sensor may separate incident light by wavelength and condense the incident light without absorbing or blocking the incident light, the light use efficiency of the image sensor may be improved.

Because the color separation lens array provided in the above-described image sensor includes nanoposts designed to exhibit a large refractive index difference so that color separation performance may be improved, the image quality of the image sensor may be improved.

Although an image sensor and an electronic apparatus including the same have been described above with reference to the example embodiments illustrated in the drawings, the illustrated example embodiments are only examples, and various modifications to the illustrated example embodiments and other equivalent embodiments may be possible. Thus, the disclosed example embodiments should be considered in a descriptive sense only and not for purposes of limitation. The scope of the present disclosure is defined not by the detailed description of the disclosure but by the appended claims, and all differences within the scope will be construed as being included in the present disclosure.

What is claimed is:

1. An image sensor comprising:

a sensor substrate comprising a first pixel and a fourth pixel configured to detect green light, a second pixel configured to detect blue light, and a third pixel configured to detect red light; and a color separation lens array spaced apart from the sensor substrate in a first direction, the color separation lens array being configured to separate incident light based on wavelengths and condense the separated incident light onto the first pixel, the second pixel, the third pixel, and the fourth pixel, wherein the color separation lens array comprises a plurality of nanoposts and a peripheral material on side surfaces of the plurality of nanoposts, wherein a region of the color separation lens array comprises a first pixel corresponding region, a second pixel corresponding region, a third pixel corresponding region, and a fourth pixel corresponding region facing the first pixel, the second pixel, the third pixel, and the fourth pixel, respectively, and the plurality of nanoposts are provided in the first pixel corresponding region, the second pixel corresponding region, the third pixel corresponding region, and the fourth pixel corresponding region, wherein the plurality of nanoposts comprise a plurality of main posts each having a refractive index greater than a refractive index of the peripheral material and a plurality of sub-posts each having a refractive index less than the refractive index of the peripheral material, and wherein in respective cross-sections of the first pixel corresponding region, the second pixel corresponding region, the third pixel corresponding region, and the fourth pixel corresponding region which are perpendicular to the first direction, ratios of a sum of respective areas of the plurality of sub-posts to a sum of respective areas of the plurality of main posts are a first fill factor, a second fill factor, a third fill factor, and a fourth fill factor, respectively, the second fill factor being largest among the first fill factor, the second fill factor, the third fill factor, and the fourth fill factor.

2. The image sensor of claim 1, wherein the plurality of sub-posts comprise air-holes adjacent to the peripheral material.

3. The image sensor of claim 1, wherein two or more sub-posts among the plurality of sub-posts are provided in the second pixel corresponding region, and wherein a sub-post among the two sub-posts located farther from a center of the second pixel corresponding region has a smaller cross-sectional size than the other sub-post among the two sub-posts.

4. The image sensor of claim 1, wherein the second fill factor is greater than 1, and the first fill factor, the third fill factor, and the fourth fill factor are 0.

5. The image sensor of claim 1, wherein, in the second pixel corresponding region, a number of the plurality of sub-posts is greater than a number of the plurality of main posts.

6. The image sensor of claim 1, wherein the third fill factor among the first fill factor, the second fill factor, the third fill factor, and the fourth fill factor is smallest.

7. The image sensor of claim 1, wherein in each of the first pixel corresponding region, the third pixel corresponding region, and the fourth pixel corresponding region, the sub-posts are located relatively in peripheral area than the main posts are located.

8. The image sensor of claim 1, wherein the plurality of nanoposts are provided sequentially in the first direction in a first lens layer and a second lens layer.

9. The image sensor of claim 8, wherein among the first fill factor, the second fill factor, the third fill factor, and the fourth fill factor of the first lens layer, the second fill factor is largest, and wherein among the first fill factor, the second fill factor, the third fill factor, and the fourth fill factor of the second lens layer, the second fill factor is largest.

10. The image sensor of claim 8, wherein among the first fill factor, the second fill factor, the third fill factor, and the fourth fill factor of the first lens layer, the third fill factor is smallest, and wherein among the first fill factor, the second fill factor, the third fill factor, and the fourth fill factor of the second lens layer, the third fill factor is smallest.

11. The image sensor of claim 8, wherein in the second lens layer, the first fill factor, the third fill factor, and the fourth fill factor are 0.

12. The image sensor of claim 8, wherein the plurality of sub-posts are not included in the first lens layer and are included in the second lens layer.

13. The image sensor of claim 12, wherein the second fill factor of the second lens layer is greater than 1.

14. The image sensor of claim 12, wherein, in the second lens layer of the second pixel corresponding region, a number of the plurality of sub-posts are greater than a number of the plurality of main posts.

15. The image sensor of claim 8, further comprising an etch stop layer between the first lens layer and the second lens layer.

16. The image sensor of claim 15, wherein, among the plurality of sub-posts, two sub-posts facing each other between the first lens layer and the second lens layer contact each other.

17. The image sensor of claim 1, further comprising an anti-reflection layer on a light-receiving surface of the color separation lens array, the anti-reflection layer comprising a plurality of holes periodically arranged two-dimensionally.

18. The image sensor of claim 1, further comprising a color filter array between the sensor substrate and the color separation lens array.

19. An electronic apparatus comprising:

a lens assembly comprising one or more lenses and configured to form an optical image of a subject;

an image sensor configured to convert the optical image formed by the lens assembly into an electrical signal; and a processor configured to process a signal obtained by the image sensor, wherein the image sensor comprises:

a sensor substrate comprising a first pixel and a fourth pixel configured to detect green light, a second pixel configured to detect blue light, and a third pixel configured to detect red light; and a color separation lens array spaced apart from the sensor substrate in a first direction, the color separation lens array being configured to separate incident light based on wavelengths and condense the separated incident light onto the first pixel, the second pixel, the third pixel, and the fourth pixel, wherein the color separation lens array comprises a plurality of nanoposts and a peripheral material on side surfaces of the plurality of nanoposts, wherein the color separation lens array comprises a first pixel corresponding region, a second pixel corresponding region, a third pixel corresponding region, and a fourth pixel corresponding region facing the first pixel, the second pixel, the third pixel, and the fourth pixel, respectively, and the plurality of nanoposts are provided in the first pixel corresponding region, the second pixel corresponding region, the third pixel corresponding region, and the fourth pixel corresponding region, wherein the plurality of nanoposts comprise a plurality of main posts each having a refractive index greater than a refractive index of the peripheral material and a plurality of sub-posts each having a refractive index less than the refractive index of the peripheral material, and wherein in respective cross-sections of the first pixel corresponding region, the second pixel corresponding region, the third pixel corresponding region, and the fourth pixel corresponding region which are perpendicular to the first direction, ratios of a sum of respective areas of the plurality of sub-posts to a sum of respective areas of the plurality of main posts are a first fill factor, a second fill factor, a third fill factor, and a fourth fill factor, respectively, the second fill factor among the first fill factor, the second fill factor, the third fill factor, and the fourth fill factor being largest among the first fill factor, the second fill factor, the third fill factor, and the fourth fill factor.

20. An image sensor comprising:

a sensor substrate comprising a first pixel and a fourth pixel configured to detect green light, a second pixel configured to detect blue light, and a third pixel configured to detect red light; and a color separation lens array spaced apart from the sensor substrate in a first direction, the color separation lens array being configured to separate incident light based on wavelengths and condense the separated incident light onto the first pixel, the second pixel, the third pixel, and the fourth pixel, wherein the color separation lens array comprises a plurality of nanoposts and a peripheral material on side surfaces of the plurality of nanoposts, wherein a region of the color separation lens array comprises a first pixel corresponding region, a second pixel corresponding region, a third pixel corresponding region, and a fourth pixel corresponding region facing the first pixel, the second pixel, the third pixel, and the fourth pixel, respectively, and the plurality of nanoposts are provided in the first pixel corresponding region, the second pixel corresponding region, the third pixel corresponding region, and the fourth pixel corresponding region, wherein the plurality of nanoposts comprise a plurality of main posts each having a refractive index greater than a refractive index of the peripheral material and a plurality of sub-posts each having a refractive index less than the refractive index of the peripheral material, and wherein, in the second pixel corresponding region, a number of the plurality of sub-posts is greater than a number of the plurality of main posts.

* * * * *